United States Patent
Akamatsu et al.

(10) Patent No.: US 7,105,221 B2
(45) Date of Patent: Sep. 12, 2006

(54) CIRCUIT BOARD, LAMINATED MEMBER FOR CIRCUIT BOARD, AND METHOD FOR MAKING LAMINATED MEMBER FOR CIRCUIT BOARD

(75) Inventors: Takayoshi Akamatsu, Otsu (JP); Futoshi Okuyama, Otsu (JP); Nobuyuki Kuroki, Otsu (JP); Hiroshi Enomoto, Mishima (JP); Tetsuya Hayashi, Otsu (JP); Yoshio Matsuda, Shiga (JP); Yoichi Shinba, Otsu (JP); Masahiro Oguni, Nagoya (JP)

(73) Assignee: Toray Industries, Inc., Tokyo (JP)

( * ) Notice: Subject to any disclaimer, the term of this patent is extended or adjusted under 35 U.S.C. 154(b) by 348 days.

(21) Appl. No.: 10/450,415

(22) PCT Filed: Jul. 17, 2002

(86) PCT No.: PCT/JP02/07242

§ 371 (c)(1),
(2), (4) Date: Jun. 13, 2003

(87) PCT Pub. No.: WO03/009657

PCT Pub. Date: Jan. 30, 2003

(65) Prior Publication Data

US 2004/0026363 A1    Feb. 12, 2004

(30) Foreign Application Priority Data

Jul. 19, 2001  (JP) ............................. 2001-219295
Feb. 5, 2002  (JP) ............................. 2002-027763

(51) Int. Cl.
*B32B 3/00* (2006.01)
*H05K 1/16* (2006.01)

(52) U.S. Cl. ...................... 428/209; 174/254; 174/260; 428/901

(58) Field of Classification Search ........ 174/254–255, 174/260; 428/209, 901
See application file for complete search history.

(56) References Cited

U.S. PATENT DOCUMENTS

| | | | | |
|---|---|---|---|---|
| 4,075,420 | A | * | 2/1978 | Walton ........................ 174/251 |
| 5,130,192 | A | * | 7/1992 | Takabayashi et al. ........ 428/332 |
| 5,372,666 | A | | 12/1994 | Kawasaki ..................... 156/89 |
| 5,972,152 | A | * | 10/1999 | Lake et al. ................... 156/247 |
| 6,103,977 | A | * | 8/2000 | Namgung .................... 174/255 |
| 6,124,004 | A | * | 9/2000 | Furuta et al. ................. 428/1.1 |

(Continued)

FOREIGN PATENT DOCUMENTS

EP    0 148 602 A2    7/1985

(Continued)

OTHER PUBLICATIONS

Non-Patent Literature document—Publication No. 182733.

Primary Examiner—Cathy F. Lam
(74) Attorney, Agent, or Firm—Kubovcik & Kubovcik

(57) ABSTRACT

The present invention relates to a circuit board including a flexible film provided with an extremely fine circuit pattern, a laminated member for a circuit board, and a method for making a laminated member for a circuit board with excellent productivity. A circuit board of the present invention includes a flexible film and a circuit pattern composed of a metal provided on the flexible film, and dimensional change rate of the circuit pattern is within ±0.01%. A laminated member for a circuit board of the present invention includes a reinforcing plate, a self-stick, removable organic layer, a flexible film, and a circuit pattern composed of a metal laminated in that order.

11 Claims, 3 Drawing Sheets

U.S. PATENT DOCUMENTS 6,420,018 B1 * 7/2002 Inoue et al. .............. 428/209

FOREIGN PATENT DOCUMENTS

| EP | 0 374 286 A1 | 6/1990 |
| JP | 61-42872 U | 3/1986 |
| JP | 5-218616 A | 8/1993 |
| JP | 7-99379 A | 4/1995 |
| JP | 7-297522 A | 11/1995 |
| JP | 11-112155 A | 4/1999 |
| JP | 2000-196243 A | 7/2000 |
| JP | 2002-232197 | 8/2002 |

* cited by examiner

CIRCUIT BOARD, LAMINATED MEMBER FOR CIRCUIT BOARD, AND METHOD FOR MAKING LAMINATED MEMBER FOR CIRCUIT BOARD

TECHNICAL FIELD

The present invention relates to a circuit board including a flexible film provided with an extremely fine circuit pattern, a laminated member for a circuit board, and a method for making a laminated member for a circuit board with excellent productivity.

BACKGROUND ART

With the reduction in size and weight of electronic products, higher precision in patterning of printed circuit boards has been required. Since flexible film substrates can be bent, which enables three-dimensional wiring, they are suitable for reduction in size of electronic products. Therefore, the demand for flexible film substrates is increasing. With respect to tape automated bonding (TAB) techniques which are used for connecting ICs to liquid crystal display panels, by the roll-to-roll process with a relatively narrow polyimide film substrate, it is possible to obtain an excellent fine-pattern as a resin substrate. However, the development of micro-fabrication with a polyimide film substrate is substantially reaching its limits. In order to evaluate accuracy of a miniaturized pattern, an index represented by the line width and the space between lines, and an index represented by the position of the pattern on the substrate are used. With respect to the line width and the space between lines, further miniaturization may be possible. The latter index, i.e., dimensional change rate, relates to the alignment accuracy between a circuit board pattern and electrode pads when the circuit board and electronic components, such as ICs, are connected to each other, and as the pitch between electrode pads in an IC is further narrowed and the number of electrode pads in an IC is increased, it becomes difficult to meet the required accuracy. That is, when an IC having more than 400 to 1,000 electrode pads is connected to a circuit pattern, extremely low dimensional change rate is required to align all the electrode pads in an IC with fine electrode pads with a pitch of 60 μm or less, preferably 50 μm or less, of the circuit pattern.

In terms of dimensional change rate, it is, in particular, difficult to improve the fabrication of flexible film substrates. In the circuit board fabrication, heat treatment processes, such as drying and curing, and wet processes, such as etching and development, are performed, and the flexible film is repeatedly subjected to expansion and shrinkage. The hysteresis during the fabrication processes causes distortion of the circuit pattern on the substrate. In the case when a plurality of processes require alignment, if expansion and shrinkage occur during such processes, positioning error occurs between patterns formed. The distortion of the flexible film due to expansion and shrinkage more greatly affects a flexible printing circuit (FPC) in which a substrate with a relatively large area is treated. Additionally, positioning error is also caused by external forces, such as tension and torsion, and, in particular, when a thin substrate is used to increase flexibility, adequate care must be taken. Since the flexible film substrate expands and shrinks due to humidity and temperature even after the circuit formation, it is absolutely necessary to control temperature and humidity of the circuit board prior to the IC connection. Even when moisture proof packaging is used, the production cost is increased, it is difficult to achieve complete moisture proofing, and the guarantee period is limited. Under the circumstances, the upper limit of dimensional change rate of the circuit pattern formed on a flexible film has been considered to be approximately ±0.015 to ±0.030%, and it is becoming difficult to cope with further narrowing of the pitch and increase in the number of electrode pads in an IC.

DISCLOSURE OF INVENTION

In view of the problems associated with the conventional techniques described above, the present inventors have conducted thorough research on an extremely fine flexible film circuit board and a method for making a laminated member for a circuit board with excellent productivity, and have found that such problems are solved by attaching a flexible film to a reinforcing plate having excellent dimensional stability with a self-stick, removable organic layer therebetween, followed by processing, and also have searched into specific preferred embodiments.

Figure 1:
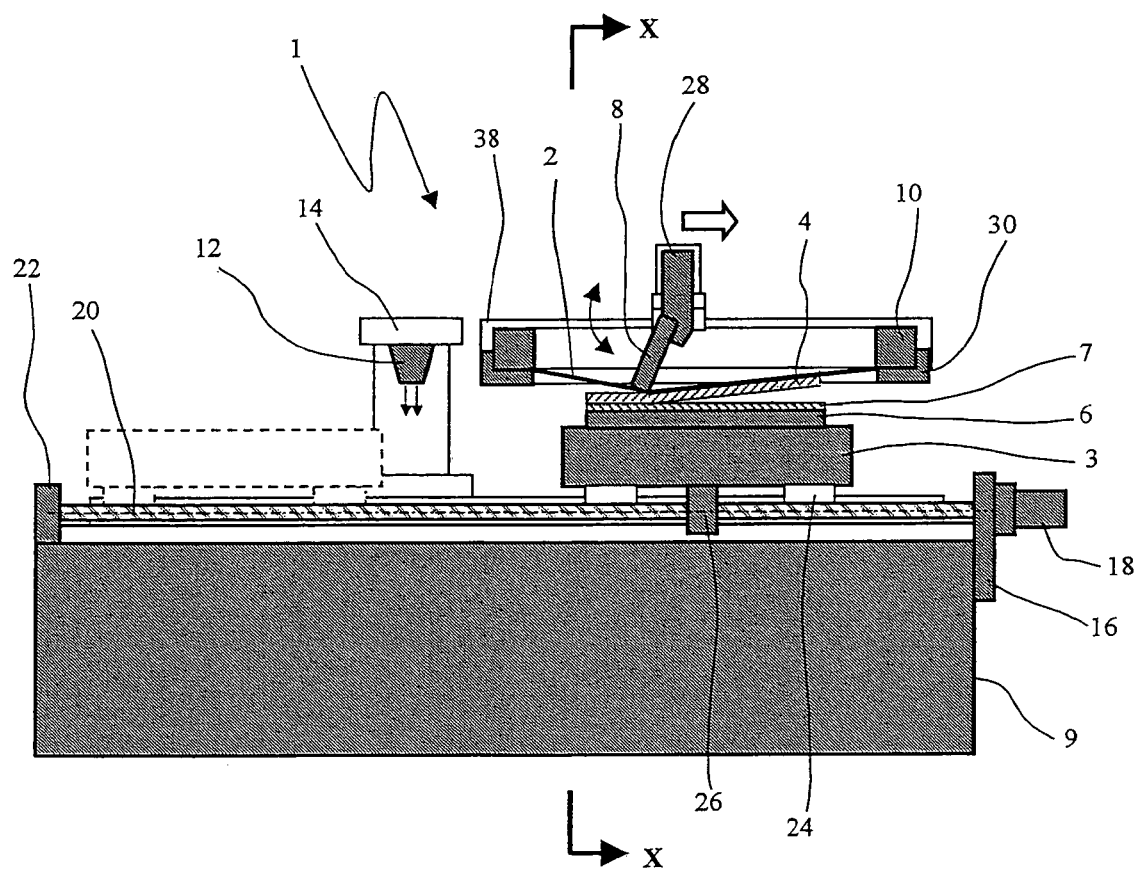
FIG. 1 is a front view which schematically shows a central part of a laminator 1 in accordance with the present invention.

REFERENCE NUMERALS 1 laminator
2 film holding sheet
3 stage
4 flexible film
6 reinforcing plate
7 self-stick, removable organic layer
8 squeegee
9 base
10 frame
12 electrostatic charging device
14 column
16 bracket
18 motor
20 ball screw
22 bracket
24 guide
26 nut
28 squeegee support
32a, 32b bearing
34 rotary cylinder
36a, 36b guide
38 rail
40 moving body
42 stator
43 linear motor
44a, 44b support
46 linear cylinder

BEST MODE FOR CARRYING OUT THE INVENTION

In one aspect of the present invention, a circuit board includes a flexible film and a circuit pattern composed of a metal provided on at least one surface of the flexible film, and dimensional change rate of the circuit pattern is within ±0.01%.

The flexible film of the present invention is a plastic film, and it is important that the plastic film has heat resistance sufficient for thermal processes in the circuit-pattern-forming step and in the electronic-component-mounting step. Examples of plastic films used include polycarbonate, polyether sulfide, polyethylene terephthalate, polyethylene naphthalate, polyphenylene sulfide, polyimide, polyamide, and liquid crystal polymer films. Among these, a polyimide film is preferably used because of its excellent heat resistance and excellent resistance to chemicals. A liquid crystal polymer is preferably used because of its excellent electrical characteristics, such as low dielectric loss. A flexible glass-fiber reinforced resin sheet may also be used.

Examples of resins of glass-fiber reinforced resin sheet include epoxy resins, polyphenylene sulfide resins, polyphenylene ether resins, maleimide (co)polymer resins, polyamide resins, and polyimide resins. The thickness of the flexible film is preferably small in view of reduction in weight and size of the electronic apparatuses and in order to form fine via-holes, while the thickness is preferably large in order to ensure mechanical strength and to maintain flatness. Therefore, the thickness of the flexible film is preferably in the range of 7.5 to 125 μm.

A circuit pattern composed of a metal is provided on the flexible film. The metal layer may be formed by laminating a metallic foil, such as a copper foil, using an adhesive layer, by sputtering, by plating, or by combining these. Alternatively, a raw material resin or its precursor for the flexible film may be applied to a metallic foil, such as a copper foil, followed by drying and curing to form a flexible film provided with a metal layer. As the metal layer, any highly conductive metal can be used, and for example, gold, silver, or aluminum may be used. As the method for forming the circuit pattern composed of the metal, a full additive process, a semi-additive process, or a subtractive process may be used.

The full additive process will be described below. A catalyst, such as palladium, nickel, or chromium, is applied to the surface on which a circuit pattern is to be formed, followed by drying. Herein, the catalyst does not act as the nucleus for plating growth as it is. However, after the catalyst is activated, it acts as the nucleus for plating growth. A photoresist is then applied thereto by a spin coater, blade coater, roll coater, bar coater, or die coater, or by screen printing, followed by drying. The photoresist is exposed through a photomask with a predetermined pattern to form a photoresist layer in the sections in which the plating film is not required. The exposed photoresist is developed. Catalyst is then activated, and the polyimide film is dipped in an electroless plating solution composed of copper sulfate and formaldehyde to form a copper-plating layer with a thickness of 2 to 20 μm. The photoresist layer is removed as required. A circuit pattern is thereby obtained.

The semi-additive process will be described below. An underlayer is deposited on a surface on which a metal layer is to be formed by sputtering of chromium, nickel, copper, or an alloy of these metals. The thickness of the underlayer is in the range of 1 to 1,000 nm. It is effective in securing sufficient conductivity for subsequent electroplating, in improving adhesion of the metal layer, and in preventing pinhole defects to deposit a copper layer by sputtering further on the underlayer at a thickness of 50 to 3,000 nm. Before the underlayer is formed, in order to improve adhesion, the surface of the polyimide film may be subjected to plasma treatment, reverse sputtering, primer layer application, or adhesive layer application as appropriate. A photoresist is applied to the underlayer, followed by drying. The photoresist is exposed through a photomask with a predetermined pattern to form a photoresist layer in the sections in which the plating film is not required. The exposed photoresist is developed. Electroplating is then performed using the underlayer as an electrode. As the electroplating solution, a copper sulfate plating solution, a copper cyanide plating solution, a copper pyrophosphate plating solution, or the like is used. A copper-plating layer is formed at a thickness of 2 to 20 μm, and optionally, plating with gold, nickel, tin, or the like is further performed. The photoresist is removed, and the underlayer is removed by slight etching. A circuit pattern is thereby obtained.

The subtractive process will be described below. First, a uniform metal layer is formed on a flexible film. In order to form the uniform metal layer, a metallic foil, such as a copper foil, may be laminated to a flexible film with an adhesive layer, or the metal layer may be formed on a flexible film by sputtering, plating, or a combination of these. Alternatively, a raw material resin or its precursor for the flexible film may be applied to a metallic foil, such as a copper foil, followed by drying and curing to form a flexible film provided with a metal layer. Next, a photoresist is applied to the metal layer, followed by drying. The photoresist is exposed through a photomask with a predetermined pattern to form a resist layer in the sections in which the metal film is required. The exposed photoresist is developed. After etching the metal layer, the photoresist layer is removed, and a circuit pattern is thereby obtained.

It is important that dimensional change rate of the circuit pattern of the present invention is within ±0.01% in order to cope with further narrowing of the pitch and increase in the number of electrode pads in an IC, and more preferably, dimensional change rate is within ±0.005.

In another aspect of the present invention, a laminated member for a circuit board includes a reinforcing plate, a self-stick, removable organic layer, a flexible film, and a circuit pattern composed of a metal laminated in that order.

Examples of materials for a substrate used as the reinforcing plate include inorganic glasses, such as soda-lime glass, borosilicate glasses, and silica glass; ceramics, such as alumina, silicon nitride, and zirconia; metals, such as stainless steels, Invar alloys, and titanium; and glass-fiber reinforced resins. All of these materials are preferably used because of their small coefficient of thermal expansion and small coefficient of hygroscopic expansion. Inorganic glasses are more preferably used because of their excellent heat resistance and resistance to chemicals in the circuit-pattern-forming step, because large-area substrates with satisfactory surface smoothness are easily obtained, because plastic deformation does not easily occur, or because particles are not easily generated by collision during transportation. Among them, a borosilicate glass represented by aluminoborosilicate glass is most preferably used because of its high modulus of elasticity and small coefficient of thermal expansion.

When a metal or a glass-fiber reinforced resin is used as the reinforcing plate, although manufacturing may be performed in the form of a long web, in other words, performed by a roll-to-roll process, in order to easily obtain low dimensional change rate, the circuit board of the present invention is preferably manufactured by sheet processing. The sheet processing is also preferable because high alignment accuracy is easily secured by optical position detection, a movable stage, etc., in the electronic-componentmounting step. Herein, the sheet processing means that, instead of a long web, individual sheets are handled.

When a glass substrate is used as the reinforcing plate, if the glass substrate has a small Young's modulus or the glass substrate is thin, since warpage and torsion are increased by the expansion and shrinkage of the flexible film, the glass substrate may be cracked when vacuum-sucked on a flat stage. Additionally, since the flexible film is deformed by vacuum suction/release, it tends to be difficult to maintain low dimensional change rate. On the other hand, if the glass substrate is thick, flatness may be degraded due to nonuniform thickness, resulting in a decrease in exposure accuracy. Additionally, handling load by a robot or the like increases and it becomes difficult to transfer substrates quickly, resulting in a decrease in the productivity and an increase in transportation cost. For the reasons described above, with respect to the glass substrate used as a reinforcing plate (when the sheet processing is used), the product of the Young's modulus (kg/mm$^2$) and the cube of the thickness (mm) is preferably 850 to 860,000 kg·mm, more preferably 1,500 to 190,000 kg·mm, and most preferably 2,400 to 110,000 kg·mm.

When a metal substrate is used as the reinforcing plate, if the metal substrate has a small Young's modulus or the metal substrate is thin, since warpage and torsion are increased by the expansion and shrinkage of the flexible film, it becomes impossible to vacuum-suck the substrate on a flat stage. Since the flexible film is deformed due to the warpage and torsion of the metal substrate, it becomes difficult to secure low dimensional change rate. Additionally, if creasing occurs, the product is considered to be a defective product. On the other hand, if the metal substrate is thick, flatness may be degraded due to nonuniform thickness, resulting in a decrease in exposure accuracy. Additionally, handling load by a robot or the like increases and it becomes difficult to transfer substrates quickly, resulting in a decrease in the productivity and an increase in transportation cost. For the reasons described above, with respect to the metal substrate used as a reinforcing plate, the product of the Young's modulus (kg/mm$^2$) and the cube of the thickness (mm) is preferably 2 to 162,560 kg·mm, more preferably 10 to 30,000 kg·mm, and most preferably 15 to 20,500 kg·mm.

The self-stick, removable organic layer used in the present invention is composed of an adhesive or pressure-sensitive adhesive, and any adhesive through which the flexible film can be attached to the reinforcing plate and from which the flexible film can be detached after processing may be used. As the adhesive or pressure-sensitive adhesive, for example, a self-stick, removable acrylic or urethane adhesive may be used. The adhesion of the adhesive is preferably in the weak adhesion range so that satisfactory adhesion is exhibited when the flexible film is processed and detachment is easily performed without causing distortion of the flexible film substrate.

A silicone resin film may be used as a release agent in the present invention. A silicone resin layer with tackiness may also be used as the self-stick, removable organic layer in the present invention. An epoxy resin layer with tackiness may also be used as the self-stick, removable organic layer.

An adhesive whose adhesion decreases in the low-temperature region, an adhesive whose adhesion is decreased by ultraviolet irradiation, or an adhesive whose adhesion is decreased by heat treatment may also be preferably used. Among them, the adhesive in which adhesion is decreased by ultraviolet irradiation is more preferably used because a change in adhesion is large before and after ultraviolet irradiation, and by crosslinking the adhesive by ultraviolet irradiation before electronic components are bonded to the substrate with high-temperature and high-pressure, it is possible to suppress softening of the adhesive due to temperature and deformation due to pressure. In order to ensure resistance to chemicals and heat resistance in the circuit-pattern-forming-step, crosslinking by ultraviolet irradiation is preferably performed before the wet process and/or heating process in the circuit-pattern-forming-step. Examples of the adhesive in which adhesion and tackiness are decreased by ultraviolet irradiation include a two-part acrylic adhesive. Examples of the adhesive in which adhesion and tackiness decrease in the low-temperature region include an acrylic adhesive which is reversibly transformed between the crystalline state and the non-crystalline state.

In the present invention, the preferable adhesion of the self-stick, removable organic layer is measured by the straight angle peel strength when a flexible film with a width of 1 cm attached to a reinforcing plate with the self-stick, removable adhesive is peeled off. The peel rate for measuring the adhesion is 300 mm/min. Herein, the weak adhesion range refers to a range of 0.1 to 100 g/cm when adhesion is measured under the conditions described above.

If the peel strength with which the flexible film is peeled off the self-stick, removable organic layer is too small, the flexible film may be detached during the formation of the circuit pattern. On the other hand, if the peel strength with which the flexile film is peeled off the self-stick, removable organic layer is too large, the flexible film is deformed during peeling, resulting in an increase in dimensional change rate. If the adhesive strength is too large, curling of the flexible film may also occur, which causes problems in the steps subsequent to peeling. The deformation and curling also depend on the Young's modulus and thickness of the flexible film. By controlling these parameters within specific ranges, the flexible film is not detached in the fabrication process, and the deformation and curling of the flexible film due to peeling can be prevented. That is, the product of A, B, and C is preferably in the range of $4.3 \times 10^{-6}$ to $4.3 \times 10^{-3}$, more preferably in the range of $8.6 \times 10^{-6}$ to $8.6 \times 10^{-4}$, and most preferably in the range of $2.15 \times 10^{-5}$ to $5.16 \times 10^{-4}$, where A (g/cm) is the peel strength, B ($\mu m^{-1}$) is the reciprocal of the thickness of the flexible film, and C (mm$^2$/kg) is the reciprocal of the Young's modulus of the flexible film.

In order to apply the self-stick, removable organic layer and a photoresist to the substrate, a wet coating method is used. Examples of wet coating apparatuses used include spin coaters, reverse coaters, bar coaters, blade coaters, roll coaters, die coaters, screen printers, dip coaters, and spray coaters. When the self-stick, removable organic layer is directly applied to individual reinforcing plates and a photoresist for forming the circuit board is directly applied to individual flexible film sheet substrates, a die coater is preferably used. That is, although a spin coater is usually used in the wet coating method for individual sheet substrates, since the thickness of coated layer is controlled by the balance between the centrifugal force due to the high revolution of the substrate and the adsorbability to the substrate, the utilization ratio of the coating solution is 10% or less, thus being ineffective. Additionally, since the centrifugal force is not applied to the center of rotation, although it depends on the types of the coating solution used, it may be difficult to apply a thixotropic coating solution or a coating solution with high viscosity uniformly to the substrate. With respect to a reverse coater, bar coater, or blade coater, in order to obtain stable coating thickness, a coating length of several tens of centimeters to several meters or more is required after discharging of the coating solution starts, and therefore, such a coater must be used carefully when individual sheet substrates are coated. With respect to a roll coater, screen printer, dip coater, or spray coater, it is difficult to obtain high accuracy in coating thickness, and the tolerance for the flow characteristic of the coating solution is narrow. With respect to a roll coater, dip coater, or a spray coater, it is difficult to form a thick film by coating. With respect to a die coater, by combining a periodically driven metering pump, a mechanism for relatively moving a substrate and a coating head, and a system for comprehensively controlling the metering pump, the substrate, and the coating head, it is possible to suppress the nonuniformity of thickness in the moving direction at the coating start section and the coating end section in the range of several millimeters to several tens of millimeters when individual sheet substrates are coated. Examples of periodically driven metering pumps are gear pumps and piston pumps. Since the self-stick, removable organic layer generally has a higher viscosity than that of a photoresist, a die coater is preferably used.

The self-stick, removable organic layer may be directly applied to the reinforcing plate, or the self-stick, removable organic layer may be applied to another base, such as a long web, and then transferred to the reinforcing plate. When the transferring method is employed, although a portion with uniform thickness only can be used, the number of steps is increased, or another base for transferring is required.

Alternatively, the self-stick, removable organic layer may be applied to the flexible film used as the substrate of the circuit board, and then laminated to the reinforcing plate.

Peeling may be performed either at the interface between the reinforcing plate and the self-stick, removable organic layer or at the interface between the self-stick, removable organic layer and the flexible film. Peeling is preferably performed at the interface between the self-stick, removable organic layer and the flexible film because the step of removing the self-stick, removable organic layer adhering to the flexible film after peeling of the self-stick, removable organic layer can be omitted. Preferably, an auxiliary adhesive layer is provided between the reinforcing plate and the self-stick, removable organic layer. Consequently, the self-stick, removable organic layer and the flexible film can be detached at the interface therebetween more reliably.

Preferably, the auxiliary adhesive agent has strong adhesion with the reinforcing plate and the self-stick, removable organic layer, and preferred examples thereof include silane, organotitanium, and organophosphorus auxiliary adhesive agents. Examples of silane auxiliary adhesive agents include halogen silanes, alkoxy silanes, and acetoxy silanes, and examples of organotitanium auxiliary adhesive agents include titanium esters, titanium acylates, and titanium chelates. Examples of organophosphorus auxiliary adhesive agents include mono-alkyl phosphates, alkyl phosphonates, and dialkyl phosphites. Preferably, a silane auxiliary adhesive agent is employed because it can be easily and smoothly applied to the reinforcing plate and it is inexpensive. When the reinforcing plate is composed of glass, an alkoxy silane represented by formula (I) below is particularly preferable because it has satisfactory wettability with glass and quickly reacts with glass to form a strong bond.

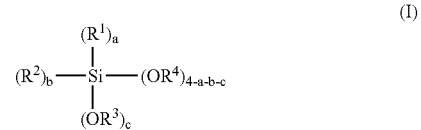

wherein, each of $R^1$ and $R^2$ is a monovalent alkyl group, $R^1$ and $R^2$ being the same or different, each of $R^3$ and $R^4$ is an alkyl group having 1 to 5 carbon atoms, $R^3$ and $R^4$ being the same or different, and each of a, b, and c is an integer of 0, 1, 2, or 3, the relationship a+b+c=1 to 3 being satisfied.

Specific examples of the alkoxy silane represented by formula (I) include, but are not limited to, vinyltrimethoxy silane, vinyltriethoxy silane, vinyltris(β-methoxyethoxy)silane, β-(3,4-epoxycyclohexyl)ethyltrimethoxy silane, γ-glycidoxypropyltrimethoxy silane, γ-glycidoxypropylmethyldiethoxy silane, γ-glycidoxypropyltriethoxy silane, γ-methacryloxypropylmethyldiethoxy silane, γ-methacryloxypropyltrimethoxy silane, γ-methacryloxypropylmethyldiethoxy silane, γ-methacryloxypropyltriethoxy silane, N-β(aminoethyl)γ-aminopropylmethyldimethoxy silane, N-β(aminoethyl)γ-aminopropyltrimethoxy silane, N-β(aminoethyl)γ-aminopropyltriethoxy silane, γ-aminopropyltrimethoxy silane, γ-aminopropyltriethoxy silane, N-phenyl-γ-aminopropyltrimethoxy silane, γ-chloropropyltrimethoxy silane, γ-mercaptopropyltrimethoxy silane, and phenyltriethoxy silane.

In the present invention, the auxiliary adhesive layer may be formed by any method, and for example, by a method in which an auxiliary adhesive agent is applied alone or as a solution obtained by dissolving the auxiliary adhesive agent in a solvent, followed by drying. Specific examples of the solvent used include acetone, methyl ethyl ketone, methyl isobutyl ketone, cyclohexanone, 2-heptanone, ethyl acetate, butyl acetate, hexyl acetate, butyl propionate, methanol, ethanol, isopropyl alcohol, ethylene glycol, propylene glycol, tetrahydrofuran, 1,3-dioxane, 1,4-dioxane, heptane, octane, nonane, decane, γ-butyrolactone, δ-decanolactone, benzene, toluene, xylene, 1,2-dichloroethane, chloroform, chlorobenzene, 1,2-dimethoxyethane, diethylene glycol dimethyl ether, diethylene glycol ethyl methyl ether, diethylene glycol diethyl ether, N,N-dimethylformamide, N,N-dimethylacetamide, dimethyl sulfoxide, N-methyl-2-pyrrolidone, and sulfolane.

If the auxiliary adhesive layer is too thin, satisfactory adhesion is not easily exhibited, and if the auxiliary adhesive layer is too thick, cracks and peeling may occur. Therefore, the thickness of the auxiliary adhesive layer is preferably 2 nm to 5 μm, and more preferably 5 nm to 1 μm.

In the present invention, in order to improve adhesion between the reinforcing plate and the self-stick, removable organic layer, roughness may be formed on the reinforcing plate. If roughness is formed on the surface of the reinforcing plate to which the flexible film is laminated, the removable organic substance enters the roughness, and adhesion with the reinforcing plate is increased by the anchoring effect. Surface roughness may be formed by sand blasting, chemical etching, or a method in which a rough surface layer is formed on the surface of the reinforcing plate, but the method is not limited thereto. In chemical etching, the reinforcing plate is immersed in an acid or alkaline aqueous solution so that the surface is etched, thus forming roughness. In particular, when the reinforcing plate is a glass substrate, since the reinforcing plate has high resistance to chemicals, high-concentration hydrogen fluoride or sodium hydroxide is preferably used. Although the material for beads used in sand blasting is not particularly limited, since the reinforcing plate is generally composed of a hard material, a glass, a ceramic, a metal, or the like is preferably used. If the particle size of the beads used in sand blasting is too small, kinetic energy that is sufficient for forming roughness cannot be obtained, and if it is too large, dense roughness cannot be obtained. Therefore, the particle size is preferably 10 μm to 1 mm. As the method in which a rough surface layer is formed on the surface of the reinforcing plate, for example, a film is formed on the reinforcing plate by mixing a blowing agent into a major ingredient of the film, and the blowing agent is then expanded. In another method, a layer is formed by mixing additives which are decomposed by heat, ultraviolet light, or the like into a major ingredient of the layer, and the additives are then removed by decomposition to form roughness.

If the size of the roughness formed as described above is too small, sufficient adhesion cannot be obtained, and if it is too large, flatness is degraded. Therefore, the average surface roughness is preferably in the range of 100 nm to 5 μm, and more preferably in the range of 1 μm to 3 μm.

In order to improve the adhesion between the reinforcing plate and the self-stick, removable organic layer, the method for providing an auxiliary adhesive layer and the method for forming a rough surface on the reinforcing plate may be used alone or in combination.

In the present invention, before the flexible film is laminated to the reinforcing plate, preferably, a circuit pattern and alignment marks are formed on one of the surfaces of the flexible film, i.e., on the laminating surface. When the reinforcing plate is transparent, the alignment marks may be read through the reinforcing plate or through the flexible film. When a metal layer is formed on the opposite surface to the laminating surface of the flexible film, the alignment marks are preferably read through the reinforcing plate because reading can be performed regardless of the pattern of the metal layer. The alignment marks may also be used for the alignment when the flexible film is laminated to the reinforcing plate. The shape of the alignment marks is not particularly limited, and any shape commonly used in aligners may be preferably used.

The circuit pattern formed on the opposite surface to the laminating surface after the lamination to the reinforcing plate has a pitch of 60 μm or less, and more preferably 50 μm or less, which is a pattern with particularly high precision. In contrast, the pattern formed on the laminating surface to the reinforcing plate is mainly used for input/output terminals to the printed circuit board, their peripheral lines, power lines and ground lines, and in some cases, precision as high as that for the circuit pattern formed on the opposite surface to the laminating surface is not required. In accordance with the present invention, double side wiring in which one side is provided with a particularly fine pattern is easily provided. Advantages of double side wiring are in that options in wiring design are enhanced by crossing lines and via holes, that it is possible to reduce noise of high-speed ICs by transmitting the ground potential to the vicinity of the necessary location by wide lines, similarly, that it is possible to prevent the power potential from decreasing even in high-speed switching by transmitting the power source potential to the vicinity of the necessary location by wide lines, thus stabilizing the IC operation, and that external noise can be blocked by electromagnetic interference sealing. In this way, the importance of double side wiring increases as the speed of ICs is increased and the number of electrode pads in an IC is increased.

In the example described above, after a surface of the flexible film, which is not laminated to the glass substrate, is provided with a circuit pattern, the flexible film is laminated to the glass substrate, and another circuit pattern is formed on the other surface of the flexible film. When both surfaces of the flexible film are provided with very fine circuit patterns, the flexible film is preferably laminated to a glass substrate before the circuit pattern is formed on the first surface. In such a case, first, the surface processed later is laminated to a glass substrate, and a circuit pattern is formed by a subtractive process, semi-additive process, or full additive process. The surface provided with the circuit is then laminated to another glass substrate, and the first glass substrate is peeled off. A circuit pattern is then formed on the other surface by subtractive process, semi-additive process, or full additive process. The glass substrate is then peeled off.

In the process in which one of the glass substrates laminated to both surfaces of the flexible film is peeled, preferably, the self-stick, removable organic layer is a type in which adhesion is decreased by ultraviolet irradiation, and the flexible film blocks ultraviolet light or a metal layer is formed over the entire surface of the flexible film so that the metal layer blocks the ultraviolet light. Additionally, as the flexibility of the glass substrate is increased, the glass substrate is more easily peeled off. Therefore, the thickness of the glass substrate is preferably 0.7 mm or less, and more preferably 0.5 mm or less.

In the present invention, preferably, the laminated member for the circuit board is formed, and after electronic components are mounted on the laminated member for the circuit board, the flexible film is detached from the reinforcing plate. When the electronic components, such as ICs, are bonded to the circuit board, in particular, when many electrode pads are bonded simultaneously, it is important to ensure low dimensional change rate. Examples of the bonding methods include a method in which a metal layer composed of tin, gold, solder, or the like formed on the electrode pads of the circuit board is bonded to a metal layer composed of gold, solder, or the like formed on the electrode pads or bumps of the electronic components by thermal pressure bonding; and a method in which, while pressure bonding a metal layer composed of tin, gold, solder, or the like formed on the electrode pads of the circuit board and a metal layer composed of gold, solder, or the like formed on the electrode pads or bumps of the electronic components to each other, an anisotropic conductive adhesive or nonconductive adhesive placed between the circuit board and the electronic components is hardened to perform mechanical bonding. In either method, the connecting sections are locally heated at 140 to 400° C. for 1 second to several minutes. The pressure applied to the connecting sections is large at 5 to 50 g per bump. If the self-stick, removable organic layer is deformed by high-temperature pressure, low dimensional change rate is not secured, and electrical connection reliability may be degraded due to the deformation of the metal layer constituting the wiring circuit pattern. In wire bonding in which many electrode pads are connected consecutively, since high-temperature pressure is applied in order to perform metal bonding, the self-stick, removable organic layer may be deformed as in the case of simultaneous bonding. In such bonding under high-temperature pressure, the deformation in the thickness direction of the circuit board is referred to as "sinking", and the sinking is preferably 6 μm or less, and more preferably 3 μm or less, so that electrical connection reliability is ensured.

The self-stick, removable organic layer of the present invention is soft in order to provide tackiness. Although the self-stick, removable organic layer with a thickness of 10 to 20 μm is usually used, in the present invention, by extremely decreasing the thickness of the self-stick, removable organic layer, the circuit board can be prevented from being deformed during electronic component bonding under high-temperature pressure. Preferably, the high-temperature pressure head used for bonding electronic components also acts as a part for supporting the electronic components in order to facilitate heating of the connecting sections. In such a case, heating and pressing are performed from the flexible film side provided with the circuit pattern. Therefore, as the thickness of the flexible film and the thickness of the circuit pattern under the high-temperature pressure head are increased, the influence of the high-temperature pressure on the self-stick, removable organic layer is decreased, and the thickness of the self-stick, removable organic layer can be increased. Preferably, the thickness of the organic layer is 5 μm or less. On the other hand, adhesion of the self-stick, removable organic layer increases as the thickness of the self-stick, removable organic layer increases, and the detachment of the flexible film in the fabrication process is easily prevented. In addition, roughness of the flexible film surface and the difference in level of circuit pattern formed thereon are easily buried to provide flat surfaces. Therefore, the thickness of the self-stick, removable organic layer is preferably in the range of 0.05 to 5 μm, more preferably in the range of 0.1 to 3 μm, and most preferably in the range of 0.2 to 2 μm.

In the method for laminating the flexible film to the reinforcing plate of the present invention, in order not to distort the flexible film so that low dimensional change rate is maintained, preferably, application of a force in the in-plane direction of the flexible film should be avoided as much as possible. In particular, when a circuit pattern is formed on one surface of the flexible film before the flexible film is laminated to the reinforcing plate, lamination is desirably performed with low stress in order to ensure alignment accuracy.

A method and apparatus for laminating the flexible film of the present invention will be described with reference to the drawings.

Figure 2:
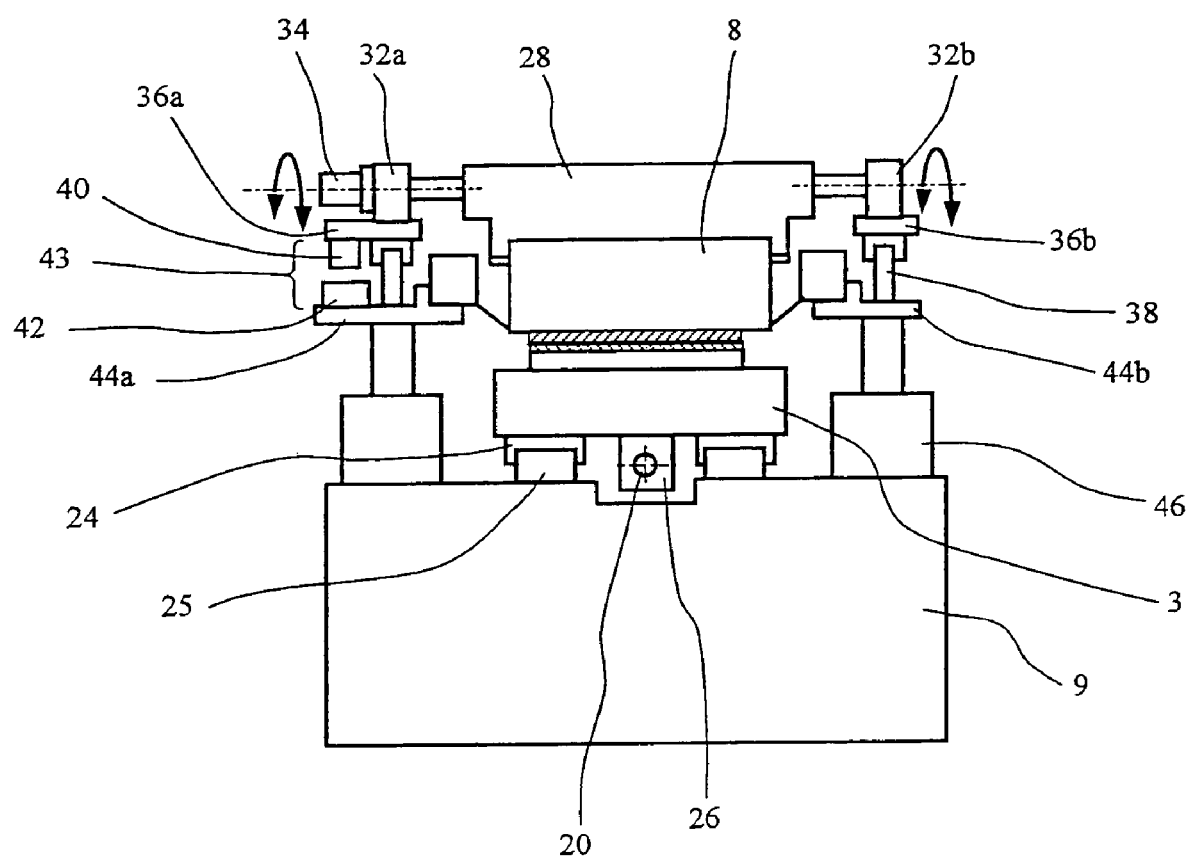
FIG. 2 is a sectional view taken along the line X—X of FIG. 1.

FIG. 1 is a front sectional view which schematically shows a central part of a laminator 1 (in which cross sections are shown by overall filling and oblique lines), and FIG. 2 is a sectional view taken along the line X—X of FIG. 1.

A laminator 1 includes a stage 3 for holding a substrate 6 which is a reinforcing plate, a film holding sheet 2 for holding a film 4 placed right above the substrate 6, a squeegee 8 for simultaneously pressing the film holding sheet 2 and the film 4 to the substrate 6 by applying pressure, and an electrostatic charging device 12 for imparting electrostatic force to the film 4 to adsorb the film holding sheet 2. Herein, the film 4 is thin and flexible. Furthermore, suction holes are arranged on the upper surface of the stage 3 and the substrate 6 can be held by suction by the operation of a source of vacuum, not shown in the drawing. By the guidance of a pair of rails 25 placed on a base 9 and a pair of guides 24 engaged with the rails 25, the stage 3 is mounted on the guides 24. The stage 3 is horizontally movable in FIG. 1. A nut 26 is attached to the bottom of the stage 3. The nut 26 is engaged with a ball screw 20 which is rotatably held by brackets 22 and 16, and the ball screw 20 is directly coupled to a motor 18 which is mounted on a side face of the base 9 with the bracket 16 therebetween. Consequently, the stage 3 can be reciprocated at a predetermined speed by the rotation of the motor 18.

The film holding sheet 2 is composed of a flexible cloth or thin film fixed on a frame 10, and is supported by supports 44a and 44b which extend in the traveling direction of the stage 3 at both sides in the width direction (in a direction orthogonal to the traveling direction) of the stage 3. Since the supports 44a and 44b are coupled to a pair of vertically movable linear cylinders 46, the film holding sheet 2 can be vertically reciprocated by the operation of the linear cylinders 46. Consequently, the film 4 held by the film holding sheet 2 faces the substrate 6 substantially in parallel and the distance therebetween can be set arbitrarily. The distance can be set by monitoring the positions by linear scales built in the linear cylinders 46.

A pair of rails 38 extending in the traveling direction of the stage 3 are mounted on the supports 44a and 44b which support the film holding sheet 2 so as to sandwich the stage 3. Guides 36a and 36b are placed on the pair of rails 38 so as to be movable in the longitudinal direction of the rails 38. Bearings 32a and 32b are mounted on the guides 36a and 36b, respectively, and a squeegee support 28 is rotatably fitted to the bearings 32a and 32b. Consequently, the squeegee 8 fastened to the squeegee support 28 is also rotatable. A moving body 40 constituting one part of the linear motor 43 is fixed to the guide 36a and a stator 42 constituting the other part of the linear motor 43 is fixed to the support 44a. Consequently, the squeegee support 28 and the squeegee 8 can be reciprocated in the traveling direction of the stage 3 by the operation of the linear motor 43 and the guidance of the rails 38 and the guides 36a and 36b. Furthermore, the squeegee support 28 rotatably supported by the bearings 32a and 32b is directly coupled to a rotary cylinder 34. Consequently, the squeegee 8 fastened to the squeegee support 28 can be pressed against the film holding sheet 2 or the press can be released by the rotation in the directions indicated by the arrows. The contact section of the squeegee 8 to the film holding sheet 2 is preferably edge-shaped. Additionally, since the squeegee 8 is eventually supported by the supports 44a and 44b, the squeegee 8 can be vertically moved together with the film holding sheet 2 by the vertical operation of the linear cylinders 46.

The electrostatic charging device 12 extends in the width direction of the stage 3 in a range larger than the width of the stage, and is supported by a column 14 above the base 9. The electrostatic charging device 12 blows positively or negatively charged ionic air to the object lying beneath the device over the width of the stage 3, and by passing the film 4 attracted to the top of the stage 3 beneath the electrostatic charging device 12, it is possible to impart electrostatic force to the film 4. Similarly, by passing the electrostatic charging device 12 above the film holding sheet 2, it is also possible to impart electrostatic force to the film holding sheet 2. Additionally, an organic layer 7 having tackiness is preliminarily attached to the upper surface of the substrate 6.

Next, a lamination method using the laminator 1 will be described with reference to FIGS. 3(a) to 3(f). FIGS. 3(a) to 3(f) are front views which schematically show steps in a lamination method in accordance with the present invention.

First, the stage 3 is moved to and stopped at the left edge position shown by the broken lines in FIG. 1, and the film 4 is placed on the stage 3 by a transport device (not shown in the drawing) and fixed by vacuum suction (FIG. 3(a)). While the stage 4 is moved rightward at a constant speed, the film 4 is passed below the electrostatic charging device 12 which emits positively charged ionic air downward so that the film 4 is positively charged. When the stage 3 reaches the position beneath the film holding sheet 2, the stage 3 is stopped and the suction of the film 4 is released. The linear cylinders 46 are moved downward to bring the film holding sheet 2 in close proximity to the film 4 on the stage 3, and are stopped when a predetermined distance is attained (FIG. 3(b)). The distance between the film 4 and the film holding sheet 2 is preferably 10 mm or less, or the face of the film 4 and the face of the film holding sheet 2 may be brought into contact with each other. Next, by rotating the rotary actuator 34, the squeegee 8 is pressed against the upper surface of the film holding sheet 2 (the opposite surface to the surface holding the film 4) so that the film 4 is sandwiched between the film holding sheet 2 and the upper surface of the stage 3. The linear motor 43 is then driven to transport the squeegee 8 from the left edge to the right edge of the film 4, and the flexible film 4 on the stage 3 is transferred to the film holding sheet 2 by electrostatic force (FIG. 3(c)).

When the film 4 is held on the film holding sheet 2, the squeegee 8 is detached from the film holding sheet 2 by rotating the rotary cylinder 34 in the opposite direction, and the linear cylinders 46 are moved upward to transport the film holding sheet 2 upward and left to stand for a while. At this stage, the squeegee 8 is moved to the left edge by operating the linear motor 43 and the stage 3 is moved to and stopped at the left edge position again by driving the motor 18. The substrate 6 provided with the organic layer 7 having tackiness on the top is placed on the stage 3 by a transport device (not shown in the drawing), and fixed by suction (FIG. 3(d)). After fixing by suction, the stage 3 is moved rightward and stopped when the stage 3 reaches the position beneath the flexible film 4 held by the film holding sheet 2 (FIG. 3(e)). The stop position of the stage 3 is set so that the film 4 can be laminated to the predetermined position on the substrate 6.

The linear cylinders 46 are driven to bring the film holding sheet 2 in close proximity to the substrate 6 on the stage 3, and stopped when a predetermined distance is attained between the film 4 and the substrate 6. The distance between the film 4 and the substrate 6 is preferably 10 mm or less. By operating the rotary cylinder 34, the squeegee 8 is pressed against the top of the film holding sheet 2 by the rotation, and the film 4 held by the film holding sheet 2 is pressed to the substrate 6. By driving the linear motor 43, the squeegee 8 is moved from the left edge to the right edge of the film 4, and the film 4 held by the film holding sheet 2 is thereby transferred to the substrate 6 on the stage 3 (FIG. 3(f)). By this operation, the flexible film 4 is laminated to the substrate 6, and strongly laminated by the adhesion of the organic layer 7. When the squeegee 8 reaches the right edge and stops, the rotary cylinder 34 is rotated in the opposite direction to move the squeegee 8 away from the film holding sheet 2. The linear cylinders 46 are then moved upward to elevate the film holding sheet 2 and suction of the stage 3 is released. The substrate 6, to which the film 4 is laminated, is carried to the next fabrication step by a transport device (not shown in the drawing). By repeating the same operation, another film 4 and another substrate 6 are laminated.

In accordance with the lamination method of the present invention, lamination is enabled with a very small dimensional change rate of the film at 0.01% or less. The reason for this is that, when the flexible film on the stage 3 is held by the film holding sheet 2, the flexible film 4 can be transferred as it is with substantially no change in the size. This is because 1) since the film holding sheet 2 which is elastically deformable in plane is used, the film holding sheet follows the roughness of the stage 3 and the film 4, and thereby the plane of the film 4 can be uniformly held; 2) since the distance between the film holding sheet 2 and the film 4 is small at 10 mm or less when their faces are brought in close proximity, the angle $\theta$ (refer to FIG. 3(c)) between the film holding sheet and the stage 3 is small at 5° or less when the squeegee 8 is moved under pressure; thereby, in the manner similar to that in the case when the film holding sheet 2 is brought in close contact with the film 4 substantially in parallel and then the film 4 is transferred to the film holding sheet 2, it is possible to transfer the film 4 from the stage 3 to the film holding sheet 2 without changing the relative position between the film 4 on the stage 3 and the film 4 on the film holding sheet 2, and therefore, strain is not caused in the film 4, resulting in no dimensional change; and 3) since the contact section of the squeegee 8 to the film holding sheet is a line, the film holding sheet 2 and the film 4 are not deformed due to pressure, and air capturing can be prevented efficiently during lamination.

When the film 4 which is held by the film holding sheet 2 without change in the size is transferred (laminated) to the substrate 6 provided with the organic layer 7, similarly, the film 4 can be transferred to the substrate 6 as it is, i.e., in the state that the film 4 is being held by the film holding sheet 2. The reasons for this are, similarly, 1) since the film holding sheet which is elastically deformable in plane is used, the film holding sheet 2 follows the roughness of the surface of the substrate 6, and thereby the film 4 can be brought into contact with the substrate 6 uniformly; 2) since the distance between the film holding sheet 2 and the substrate 6 is small at 10 mm or less, the angle $\phi$ (refer to FIG. 3(f)) between the film holding sheet and the substrate 6 is small at 5° or less when pressed by the squeegee; thereby, because the film 4 is brought into close contact with the substrate 6 substantially in parallel and then is transferred to substrate 6, it is possible to transfer the film 4 from the film holding sheet 2 to the substrate 6 without changing the relative position between the film 4 on the film holding sheet 2 and the film 4 on the substrate 6, and therefore, strain is not caused in the film 4, resulting in no change in the size; and 3) since the contact section of the squeegee 8 to the film holding sheet is a line, the film 4 is not deformed due to pressure and air capturing can be prevented efficiently during lamination.

Additionally, in order to control the dimensional change rate at 0.005% or less, the distance between the film 4 and the substrate 6 which are substantially in parallel is set at preferably 5 mm or less, and more preferably 1 mm or less.

With respect to the squeegee 8, in order to enable the contact line to be thinner, the tip which acts as the contact part is preferably edge-shaped, or rounded with an r value of 5 mm or less. The material for the tip may be a hard material, such as a metal, ceramic, or synthetic resin. Alternatively, in order to apply pressure uniformly, a rubber with a Shore hardness of 50 to 90 may be used. Preferably, the squeegee 8 and the film holding sheet 2 are coated with a fluorocarbon resin or the like so that satisfactory sliding is enabled and dust generation is suppressed when the squeegee 8 is pressed against and moved over the film holding sheet 2. In order to further suppress dust generation, the squeegee 8 may be a rotatable pressure roll. As the pressure roll, either a metal roll or a rubber-coated roll may be used. In order to make the contact line thinner to avoid capturing of air, preferably a roll with a small diameter of 30 mm or less is employed. The pressure by the squeegee is preferably 5 to 500 N/m, and more preferably 10 to 100 N/m. The moving rate of the squeegee during lamination is preferably 0.1 to 50 m/min, and more preferably 5 to 15 m/min.

The film holding sheet 2 is preferably composed of a flexible cloth or thin film because it must be elastically deformable in plane. The frame 10 which supports the film holding sheet desirably has satisfactory strength and flatness, and is preferably composed of a metal, synthetic resin, fiber reinforced resin, or the like.

As the flexible cloth, a mesh cloth obtained by weaving polyester, polypropylene, liquid crystal polymer or stainless steel fibers is preferably used. It is acceptable to form openings in the cloth using a photosensitive coating film or the like. Examples of the thin films used in the present invention include plastic films, such as polyester, polyimide, and polyphenylene sulfide films. It is acceptable to form openings by cutting such plastic films. Furthermore, a hard rubber may also be employed.

As the means for holding the film 4 on the film holding sheet 2, in addition to the electrostatic force described above, surface tension of a liquid, adhesion of an organic substance, or vacuum suction may be used. Surface tension of a liquid, electrostatic force, or adhesion of an organic substance is preferably used because the holding power and the peel strength are easily balanced with each other and a large-scale apparatus is not required. The methods in which surface tension is used and in which electrostatic force is used are more preferable compared to the method in which adhesion of an organic substance is used because of superior durability and reproducibility.

The method in which electrostatic force is used is not particularly limited as long as one of the film holding sheet 2 and the film 4 is charged or polarities of the charges of the film holding sheet 2 and the film 4 are opposite to each other. Specifically, in order to charge either the film holding sheet 2 or the film 4, in addition to the method of applying positive or negative ionic air as described above, when the film holding sheet 2 is electrically conductive, by applying a high voltage, the film 4 can be attracted thereto. Furthermore, when a metal film is formed on the surface of the film 4, by applying a high voltage to the metal film, the film holding sheet 2 and the film 4 are attracted to each other, and thereby holding is performed.

As an example of the method in which surface tension of a liquid is used, before holding, a liquid is attached to the surface of the film 4 or the film holding sheet 2 by coating, spraying, or dew condensation, and the film 4 and the film holding sheet 2 are put on each other to form a thin layer of the liquid between the film 4 and the film holding sheet 2. In another effective method, a liquid is scattered on the contact surface of the film holding sheet 2 and/or the film 4 beforehand, both are put on each other, and the surface opposite to the contact surface is squeezed by moving a squeegee so that the thickness of the liquid layer between the film holding sheet 2 and the film 4 is decreased. In another method, the film holding sheet 2 composed of a flexible cloth with openings and the film 4 are brought into contact with each other in the dry state, a liquid is scattered to the film holding sheet 2 side opposite to the contact section, and the liquid is supplied to the space between the film holding sheet 2 and the film 4 through the openings of the film holding sheet by a squeegee. This method is preferred because liquid supply and squeegeeing are simultaneously performed, resulting in a reduction in takt time. As the liquid for imparting adhesion, water is preferably used because it has relatively large surface tension and is unlikely to act as an impurity in the subsequent fabrication steps. In order to adjust surface tension, an alcohol may be added to water.

As an example of the method in which adhesion of an organic substance is used, an adhesion layer is provided between the laminating surfaces of the film holding sheet 2 and the film 4. In such a case, an adhesive with weak to strong adhesion is preferably formed in a dot shape or stripe shape to decrease adhesion so that the film 4 is easily detached from the film holding sheet 2. Consequently, adhesion and peel strength are easily balanced, and durability is improved. Preferably, dots with a diameter of 0.1 to 2 mm are arrayed with a separation of 1 to 10 mm because adhesion and peel strength are balanced and satisfactory holding power of the flexible film is ensured.

A method for making a circuit board of the present invention will be described. However, the present invention is not limited thereto.

To an aluminoborosilicate glass with a thickness of 0.7 mm, a silane coupling agent, as an auxiliary adhesive layer, is applied by a spin coater, blade coater, roll coater, bar coater, or die coater, by screen printing, or the like. A spin coater is preferably used in order to apply a thin film of a silane coupling agent with relatively low viscosity uniformly to individual sheet substrates periodically delivered. After the silane coupling agent is applied, drying is performed by heating or by vacuum, and a silane coupling auxiliary adhesive layer with a thickness of 20 nm is obtained.

An ultraviolet curable, self-stick, removable adhesive agent is applied to the silane coupling agent layer by a spin coater, blade coater, roll coater, bar coater, or die coater, by screen printing, or the like. In order to apply the ultraviolet curable, self-stick, removable adhesive agent with relatively high viscosity uniformly to the individual sheet substrates periodically delivered, a die coater is preferably used. After the self-stick, removable adhesive agent is applied, drying is performed by heating or by vacuum to obtain a self-stick, removable adhesive layer with a thickness of 1 µm. An air-shielding film composed of a release film in which a silicone resin layer is placed on a polyester film is attached to the adhesive layer of rework style and is left to stand for one week at room temperature. This period is referred to as "maturation", in which crosslinking of the self-stick, removable adhesive agent proceeds and adhesion gradually decreases. The storage time and temperature are selected so as to obtain desired adhesion. Instead of attaching the air-shielding film, storing may be performed in a nitrogen atmosphere or in a vacuum. A self-stick, removable adhesive agent may be applied to a long web, dried, and then transferred to a reinforcing plate.

Next, a polyimide film with a thickness of 25 µm is prepared. The air-shielding film on the glass substrate is removed and the polyimide film is attached to the glass substrate. As described above, at least one surface of the polyimide film may be provided with a metal layer. The polyimide film which has been cut into cut sheets with a predetermined size may be used, or the polyimide film may be laminated and cut sequentially while unwinding a roll of the polyimide film. In such a lamination process, the method in which the flexible film is held on the film holding sheet and pressed against the reinforcing plate to transfer the flexible film to the reinforcing plate, as described above, is preferably used.

A circuit pattern is then formed on the opposite surface to the laminated surface of the polyimide film by a full additive process, a semi-additive process, or a subtractive process. The semi-additive process is preferably employed because fine pitch patterns can be formed with high productivity.

In the semi-additive process, an underlayer for ensuring electrical conductivity is formed by sputtering chromium, nickel, copper, or an alloy of these metals. Before the underlayer is formed, in order to improve adhesion between the underlayer and the polyimide film, the surface of the polyimide film may be subjected to plasma treatment, reverse sputtering, primer layer application, or adhesive layer application as appropriate. Above all, application of an adhesive layer composed of an epoxy resin, acrylic resin, polyamide resin, polyimide resin, NBR, or the like is preferred because of its large adhesion improving effect. The adhesive preferably has high hardness in order to prevent sinking due to high temperature and high pressure in the electronic-component-connecting step, and preferably has a thickness of 2 μm or less. Such treatment and application may be performed before or after the lamination of the reinforcing plate. Preferably, a treatment with a roll-to-roll system is performed on a long polyimide film before the reinforcing plate is laminated in view of improvement in productivity.

The thickness of the underlayer is in the range of 1 to 1,000 nm. It is effective in securing sufficient conductivity for subsequent electroplating, in improving the adhesion of the metal layer, and in preventing pinhole defects to deposit a copper layer by sputtering further on the underlayer at a thickness of 50 to 3,000 nm. The underlayer may be formed after the flexible film is laminated to the reinforcing plate, or may be formed, for example, on a long web before lamination. A photoresist is applied to the underlayer thus formed by a spin coater, blade coater, roll coater, or die coater, or by screen printing, followed by drying. The photoresist is exposed through a photomask with a predetermined pattern to form a resist layer in the sections in which the plating film is not required. The exposed photoresist is developed. Electroplating is then performed using the underlayer as an electrode. As the electroplating solution, a copper sulfate plating solution, copper cyanide plating solution, copper pyrophosphate plating solution, or the like is used. A copper-plating layer is formed at a thickness of 2 to 20 μm, and the photoresist is removed. The underlayer is removed by slight etching to obtain a circuit pattern. Furthermore, plating of gold, nickel, tin, or the like is performed as required.

In the circuit-pattern formation step, connecting holes may be formed in the polyimide film. That is, via-holes may be formed in order to provide electrical connection between the metal layer formed on the surface laminated to the reinforcing plate, or holes for placing balls for a ball grid array package may be formed. In order to produce a fine pitch pattern, since dimensional change rate of the connecting holes is important as well as dimensional change rate of the circuit pattern, preferably, after the flexible film is laminated to the reinforcing plate to secure dimensional stability, the connecting holes are formed from the opposite surface to the laminated surface of the polyimide film. In order to form the connecting holes, laser drilling by a carbon dioxide laser, YAG laser, excimer laser, or the like, or chemical etching may be employed. When laser drilling is employed, a metal layer is preferably formed as a stopper layer on the surface of the polyimide film to which the reinforcing plate is laminated. As a chemical etchant, hydrazine, potassium hydroxide, or the like may be used. As a mask for chemical etching, a patterned photoresist or metal layer may be used. When electrical connection is made, after connecting holes are formed, preferably, the inner surfaces of the holes are plated simultaneously with the formation of the metal layer pattern on the polyimide film described above. The connecting hole for electrical connection has a diameter of 15 to 200 μm. The hole for placing the ball preferably has a diameter of 50 to 800 μm, and more preferably 80 to 800 μm.

Next, electronic components, such as IC chips, resistors, and capacitors, are mounted on the circuit pattern thus formed. Any apparatus for mounting electronic components may be used in the present invention as long as it has a function of optical position detection and an alignment mechanism, such as a movable stage, so that low dimensional change rate is ensured. The present invention is particularly effective in securing mounting accuracy of large-scale ICs with small connection pitch and a large number of pins. The IC package form is not particularly limited, and the present invention is applicable to all of bare chips, lead frame types, and ball grid array types. Preferably, the present invention is applied to bare chips or ball grid array types in which the number of pins is increased.

The method for connecting electronic components to the circuit board in the present invention is not particularly limited. In the method in which many electrode pads or bumps are connected simultaneously, it is important to ensure low dimensional change rate, to which the present invention is preferably applied. Examples of the methods for connecting many electrode pads simultaneously include a method in which a metal layer composed of tin, gold, solder, or the like formed on the electrode pads of the circuit board is bonded to a metal layer composed of gold, solder, or the like formed on the electrode pads or bumps of the electronic components by thermal pressure bonding; a method in which, while pressure bonding a metal layer composed of tin, gold, solder, or the like formed on the electrode pads of the circuit board and a metal layer composed of gold, solder, or the like formed on the electrode pads or bumps of the electronic components to each other, an anisotropic conductive adhesive or nonconductive adhesive placed between the circuit board and the electronic components is hardened to perform mechanical bonding; and a method in which electronic components are temporarily fixed on a solder paste pattern-printed on electrode pads, and then connection is performed by simultaneous reflowing. The present invention is greatly effective in the connecting method by thermal pressure bonding.

By mounting electronic components in the state in which the circuit board is laminated to the glass substrate, it is possible to eliminate controlling of temperature and humidity and moisture proof packaging after the fabrication of the circuit board until mounting of electronic devices. In particular, in flexible films, an irreversible dimensional change is often caused by moisture absorption, and the present invention greatly contributes to ensuring of the connecting accuracy between the circuit board and electronic devices. Furthermore, even if the circuit board is deformed by stress caused when the circuit board is peeled off the glass substrate, by mounting electronic devices to the circuit board before the circuit board is peeled off the glass substrate, it is possible to prevent impairment of the connecting accuracy when the electronic devices are connected.

After the circuit board and the electronic components are connected to each other, the circuit board is peeled off the glass substrate. Before peeling, preferably, the polyimide film provided with the circuit pattern is separated into single pieces or sets of single pieces by a laser, a jet of high-pressure water, a cutter, or the like because handling after peeling is facilitated. In addition, if the polyimide film is cut into single pieces or sets of single pieces when the circuit pattern is formed, stress is unlikely to remain in the polyimide film, which is desirable.

The present invention will be described in more detail based on the examples below. However, the present invention is not limited thereto. The performance values were measured according to the following methods.

Young's modulus of glass plate: Calculated according to JIS R1602

Young's modulus of metal plate: Calculated according to ASTM E1876-01

Peel strength: A polyimide film was laminated to a self-stick, removable adhesive layer formed on a reinforcing plate, and then the polyimide film was cut into a width of 10 mm. The strength by which the 10 mm wide polyimide film was peeled in the straight angle direction at a peel rate of 300 mm/min using "Tensilon" manufactured by TMI was defined as the peel strength.

EXAMPLE 1

As an auxiliary adhesive, γ-aminopropyltriethoxy silane was dissolved in isopropyl alcohol so as to obtain a concentration of 5% by weight. The auxiliary adhesive solution was applied by a spin coater to a square aluminoborosilicate glass with a side of 300 mm and a thickness of 0.7 mm, followed by drying at 100° C. for 5 minutes. The dried auxiliary adhesive layer had a thickness of 300 nm.

A mixture obtained by mixing an acrylic adhesive "SK-DYNE" SW-11A (manufactured by Soken Chemical and Engineering Co., Ltd.), in which adhesion was decreased by ultraviolet curing, with a curing agent L45 (manufactured by Soken Chemical and Engineering Co., Ltd.) at a mixing ratio of 50:1 was applied to the glass substrate provided with the auxiliary adhesive layer, followed by drying at 80° C. for 2 minutes. The dried self-stick, removable adhesive layer had a thickness of 1 μm. Next, an air-shielding film composed of a film in which an easily releasable silicone resin layer was placed on a polyester film was attached to the adhesive layer and was left to stand for one week. The glass substrate had a Young's modulus of 7,140 kg/mm$^2$, and the product of the Young's modulus (kg/mm$^2$) and the cube of the thickness (mm) was 2,449 kg·mm.

An adhesive for improving the adhesion of the metal layer was prepared as described below. Into a flask in which the atmosphere was replaced with nitrogen, 228 parts by weight of N,N-dimethylacetamide was put and 19.88 parts by weight of 1,1,3,3-tetramethyl-1,3-bis(3-aminopropyl)disiloxane was dissolved therein. 25.76 parts by weight of 3,3',4,4'-benzophenonetetracarboxylic dianhydride was added thereto and stirred in the nitrogen atmosphere at 10° C. for 1 hour. Reaction was carried out while stirring at 50° C. for 3 hours, and an adhesive composed of polyimide precursor varnish was thereby obtained.

Using a comma coater, the adhesive was continuously applied to one surface of a long polyimide film ("UPILEX" manufactured by Ube Industries, Ltd.) with a Young's modulus of 930 kg/mm$^2$, a thickness of 25 μm, and a width of 300 mm. Next, drying was performed at 80° C. for 10 minutes, at 130° C. for 10 minutes, and at 150° C. for 15 minutes, and curing was performed at 250° C. for 5 minutes. The thickness of the cured adhesive layer was 0.5 μm.

The polyimide film on which the adhesive was deposited was cut into a square with a side of 300 mm and was stored in an atmosphere of 25° C. and 45% RH for 10 hours. The polyimide film was then placed on the stage 3 provided with a vacuum suction mechanism shown in FIGS. 1 and 3 with the adhesive layer surface facing upward, and vacuum suction was performed. Next, the polyimide film was passed below the electrostatic charging device 12 while moving the stage 3. At this time, negative ionic air was blown from the electrostatic charging device 12 to negatively charge the polyimide film. A 100-mesh screen gauze composed of polyester filaments was moved downward and brought into contact with polyimide film 4. In such a state, the stage was moved so that the screen gauze 2 passed below the electrostatic charging device 12 which was switched so as to blow positive ionic air, and the screen gauze 2 was positively charged. The surface of the screen gauze 2 opposite to the stage was squeegeed by a rubber plate 8 to ensure the adhesion between the polyimide film 4 and the screen gauze 2. The vacuum suction of the stage 3 was stopped, the screen gauze 2 was moved upward, and the polyimide film 4 was transferred to the screen gauze 2.

The glass substrate 6 provided with the adhesive layer 7 was placed on the stage 3 provided with the vacuum suction mechanism. The air-shielding film on the adhesive layer was removed in advance. The screen gauze 2 laminated with the polyimide film 4 was moved to a position above the glass substrate 6.

The screen gauze 2 laminated with the polyimide film 4 was moved downward and placed parallel to the glass substrate with a separation of 0.7 mm. Next, the surface of the screen gauze 2 opposite to the surface abutting on the polyimide film was squeegeed by a rubber plate 8 with a Shore hardness of 50 to press the polyimide film 4 against the self-stick, removable adhesive layer 7, and the polyimide film 4 was thereby transferred to the glass substrate. The screen gauze was passed below the electrostatic charging device 12 which was switched so as to blow positive and negative ionic air, and the charges of the screen gauze were neutralized.

The glass substrate laminated with the polyimide film was removed from the stage and was irradiated with ultraviolet light at 1,000 mJ/cm$^2$ from the glass substrate side to cure the self-stick, removable adhesive layer.

On the polyimide film laminated on the glass substrate, a chromium-nickel alloy layer with a thickness of 4 nm and a copper layer with a thickness of 200 nm were deposited in that order by sputtering. In the alloy composition, the weight ratio of chromium to nickel was 20:80.

A positive photoresist was applied to the copper layer by a spin coater and dried at 110° C. for ten minutes. The photoresist was exposed through a photomask. Next, the photoresist was developed, and a resist layer with a thickness of 10 μm was thereby formed in the sections which did not require a plating layer. In the photomask pattern for testing, one unit consisted of 380 connecting pads (20 μm wide, 200 μm long) with a pitch of 50 μm arrayed in two parallel columns and a distance of 1.5 mm between the centers of the adjacent pads, and respective units were uniformly arrayed with a pitch of 40 mm in 7 rows and 7 columns on a square polyimide film with a side of 300 mm. At the same time, for the purpose of measuring length, 4 markers were provided on the photomask pattern at four points diagonally apart from the center of the substrate with a distance of approximately 141 mm (the distance between the individual points being 200 mm in parallel to the side).

Next, using the copper layer as an electrode, a copper layer with a thickness of 5 μm was formed by electroplating. A copper sulfate plating solution was used as the electroplating solution. The photoresist was removed by a photoresist stripper, and the copper layer and the chromium-nickel alloy layer below the resist layer were removed by soft etching using a hydrogen peroxide-sulfuric acid aqueous solution. A nickel layer with a thickness of 1 μm and a gold layer with a thickness of 0.2 μm were deposited by electroplating in that order on the copper-plating layer. The nickel electroplating was performed in a Watt bath. As the gold electroplating solution, a neutral gold plating solution including aurous potassium cyanide was used. A metal layer pattern was thereby formed.

Using a 150-mesh polyester screen, a solder resist NPR-90 (manufactured by Nippon Polytex) was applied by a screen printer to the entire surface of the polyimide film provided with a metal pattern, followed by drying at 70° C. for 30 minutes. Next, in order to remove the solder resist on the electrode pad units arrayed in 7 rows and 7 columns and on the markers for measuring length, the solder resist was irradiated with ultraviolet light at 600 mJ/cm$^2$ through a photomask, and the solder resist was developed while spraying 1% by weight sodium carbonate aqueous solution. Curing was performed at 150° C. for 30 minutes to cure the solder resist. A laminated member for a circuit board was thereby obtained.

The distance between the two points, which were provided for measuring length as described above, originally about 283 mm apart diagonally (200 mm in the x direction, 200 mm in the y direction) was measured by a length-measuring device SMIC-800 (manufactured by Sokkia Co., Ltd.). As a result, dimensional change rate was extremely satisfactory, i.e., within ±5 μm (±5 μm divided by 283 mm equals ±0.0018%) relative to the photomask pattern.

Furthermore, the resultant laminated member for the circuit board was left to stand in an atmosphere of 30° C. and 80% RH for one week. While heating an IC chip model, in which 380 bumps plated with gold were arrayed with a pitch of 50 μm per one row and two rows were arrayed with a separation of 1.5 mm, at 150° C. from the chip side, using an ultrasonic bonder FC2000 (manufactured by Toray Engineering Co., Ltd.), metal diffusion bonding with the electrode pads on the circuit board was performed. Each bump had a width of 30 μm, a length of 50 μm, and a height of 14 μm. The pressure for each bump was 30 g. The alignment of the bumps of the IC chip model with the electrode pads on the circuit board was satisfactory. A cross section of the connecting part was taken and observed by an electron microscope. As a result, the sinking of the bumps was small at 1.7 μm, which caused no problems in reliability.

An edge of the polyimide film was vacuum-sucked and the polyimide film was gradually peeled off the glass substrate. A circuit board was thereby obtained. At this stage, the peel strength was 2 g/cm, and the product A×B×C, i.e., the product of the peel strength A (g/cm), the reciprocal B (1/μm) of the thickness of the polyimide film, and the reciprocal C (mm$^2$/kg) of the Young's modulus of the polyimide film, was 8.6×10$^{-5}$. The polyimide film was not detached from the adhesion layer in the circuit-pattern-forming step. When the polyimide film was peeled off, the polyimide film was peeled off at the interface with the adhesion layer, and curling of the polyimide film did not occur. The resultant circuit board was stored in an atmosphere of 25° C. and 45% RH for 10 hours. The distance between the two points, which were provided for measuring length as described above, originally about 283 mm apart diagonally (200 mm in the x direction, 200 mm in the y direction) was measured by the length-measuring device SMIC-800. As a result, dimensional change rate was maintained extremely satisfactorily, i.e., within ±5 μm (±5 μm divided by 283 mm equals ±0.0018%) relative to the photomask pattern.

EXAMPLE 2

An adhesive for improving the adhesion of a metal layer was prepared in the same manner as that in Example 1. The adhesive was continuously applied to a long polyimide film ("UPILEX" manufactured by Ube Industries, Ltd.) with a thickness of 25 μm and a width of 300 mm, followed by drying and curing in the same manner as that in Example 1. The other surface of the polyimide film was coated with the adhesive similarly, followed by drying and curing.

On one of the surfaces of the polyimide film provided with the adhesive layers, a chromium-nickel alloy layer with a thickness of 5 nm and a copper layer with a thickness of 200 nm were deposited in that order by a sputtering apparatus with a roll-to-roll system. In the alloy composition, the weight ratio of chromium to nickel was 20:80. A copper-plating layer with a thickness of 5 μm was formed on the copper layer by an electroplating apparatus with a roll-to-roll system. As the plating solution, copper sulfate was used.

The polyimide film provided with the copper-plating layer was cut into a square sheet with a side of 300 mm. A dry film was laminated on the copper-plating layer by a roll laminator, and a dry film resist pattern was formed by exposing the dry film resist through a photomask and by developing. In the photomask pattern for testing, one unit consisted of 28 pads with a diameter of 500 μm arrayed on a straight line with a pitch of 10 mm, and respective units were arrayed with a pitch of 40 mm in 6 rows in parallel from a position 50 mm apart from the side of the square polyimide film with a side of 300 mm. Furthermore, every other adjacent pad was connected with a line with a width of 100 μm.

By showering a ferric chloride aqueous solution onto the polyimide film provided with the dry film resist pattern, the copper layer was patterned, and also the chromium-nickel alloy layer under the copper layer was patterned. A wiring pattern and alignment marks were thereby formed. The dry film resist was then removed by a resist stripper. A polyimide film provided with the pads and the wiring pattern on one surface thereof was thereby obtained.

In the same manner as that in Example 1, an auxiliary adhesive layer and an adhesive layer were formed on a square aluminoborosilicate glass with a side of 300 mm and a thickness of 0.7 mm. An air-shielding film was attached thereto and left to stand for one week.

The polyimide film provided with the pads and the wiring pattern on one surface thereof was stored in an atmosphere of 25° C. and 45% RH for 10 hours. The polyimide film was then placed on the stage 3 provided with a vacuum suction mechanism shown in FIGS. 1 and 3 with the surface provided with the pads and the wiring pattern facing downward, and vacuum suction was performed. The polyimide film was laminated to the glass substrate in the same manner as that in Example 1.

The glass substrate laminated with the polyimide film was removed from the stage and was irradiated with ultraviolet light at 1,000 mJ/cm$^2$ from the glass substrate side to cure the adhesive layer.

Next, the polyimide film was shot with a short-pulse carbon dioxide laser, a via hole with a top diameter of 120 μm and a bottom diameter of 60 μm was formed at the position corresponding to the pad previously formed with a diameter of 500 μm. Smears on the bottom of the via hole were removed by immersing the polyimide film in a permanganic acid aqueous solution.

A chromium-nickel alloy layer and a copper layer were deposited on the polyimide film in that order in the same manner as that in Example 1. Then a positive photoresist layer was formed on the copper layer, followed by exposure and development. In the photomask pattern for testing, in the same manner as that in Example 1, one unit consisted of 380 connecting pads (20 μm wide, 200 μm long) with a pitch of 50 μm arrayed in two parallel columns and a distance of 1.5 mm between the centers of the adjacent pads, and respective units were uniformly arrayed with a pitch of 40 mm in 7 rows and 7 columns on a square polyimide film with a side of 300 mm. At the same time, for the purpose of measuring length, 4 markers were provided on the photomask pattern at four points diagonally apart from the center of the substrate with a distance of approximately 141 mm (the distance between the individual points being 200 mm in parallel to the side).

Next, using the copper layer as an electrode, a copper layer with a thickness of 5 μm was formed by electroplating. A copper sulfate plating solution was used as the electroplating solution. The photoresist was removed by a photoresist stripper, and the copper layer and the chromium-nickel alloy layer below the resist layer were removed by soft etching using a hydrogen peroxide-sulfuric acid aqueous solution. A nickel layer with a thickness of 1 μm and a gold layer with a thickness of 0.2 μm were deposited by electroplating in that order on the copper plating layer. As the nickel electroplating solution, a nickel sulfate plating solution was used. As the gold electroplating solution, an aurous potassium cyanide plating solution was used. A metal layer pattern was thereby formed. Next, in the same manner as that in Example 1, a solder resist pattern was formed and a laminated member for a circuit board was obtained.

The distance between the two points, which were provided for measuring length as described above, originally about 283 mm apart diagonally (200 mm in the x direction, 200 mm in the y direction) was measured by a length-measuring device SMIC-800 (manufactured by Sokkia Co., Ltd.). As a result, dimensional change rate was extremely satisfactory, i.e., within ±5 μm (±5 μm divided by 283 mm equals ±0.0018%) relative to the photomask pattern.

Furthermore, the resultant laminated member for the circuit board was left to stand in an atmosphere of 30° C. and 80% RH for one week. While heating an IC chip model, in which 380 bumps plated with gold were arrayed with a pitch of 50 μm per one row and two rows were arrayed with a separation of 1.5 mm, at 150° C. from the chip side, using an ultrasonic bonder FC2000 (manufactured by Toray Engineering Co., Ltd.), metal diffusion bonding with the electrode pads on the circuit board was performed. Each bump had a width of 30 μm, a length of 50 μm, and a height of 14 μm. The pressure for each bump was 30 g. The alignment of the bumps of the IC chip model with the electrode pads on the circuit board was satisfactory. A cross section of the connecting part was taken and observed by an electron microscope. As a result, the sinking of the bumps was small at 1.7 μm, which caused no problems in reliability.

An edge of the polyimide film was vacuum-sucked and the polyimide film was gradually peeled off the glass substrate. At this stage, the peel strength was 2 g/cm, and the product A×B×C, i.e., the product of the peel strength A (g/cm), the reciprocal B (1/μm) of the thickness of the polyimide film, and the reciprocal C (mm$^2$/kg) of the Young's modulus of the polyimide film, was 8.6×10$^{-5}$. The polyimide film was not detached from the adhesion layer in the circuit-pattern-forming step. When the polyimide film was peeled off, the polyimide film was peeled off at the interface with the adhesion layer, and curling of the polyimide film did not occur. The resultant circuit board was stored in an atmosphere of 25° C. and 45% RH for 10 hours.

The distance between the two points, which were provided for measuring length, originally about 283 mm apart diagonally (200 mm in the x direction, 200 mm in the y direction) was measured by the length-measuring device SMIC-800. As a result, dimensional change rate was maintained extremely satisfactorily, i.e., within ±5 μm (±5 μm divided by 283 mm equals ±0.0018%) relative to the photomask pattern.

EXAMPLE 3

A laminated member for a circuit board was obtained in the same manner as that in Example 1. Next, an edge of the polyimide film was vacuum-sucked and the polyimide film was gradually peeled off the glass substrate. The resultant circuit board was left to stand in an atmosphere of 30° C. and 80% RH for one week, and bonding was attempted by aligning an IC chip model that is similar to that in Example 1 with electrode pads on the circuit board. Due to strain of the circuit board, in 4 units out of 49 units on the circuit board, it was not possible to align the electrode pads on the circuit board with the bumps in the IC.

COMPARATIVE EXAMPLE 1

An adhesive for improving the adhesion of the metal layer was prepared in the same manner as that in Example 1. As in Example 1, the adhesive was continuously applied to one surface of a long polyimide film ("UPILEX" manufactured by Ube Industries, Ltd.) with a thickness of 25 μm and a width of 300 mm, followed by drying and curing.

On one of the surfaces of the polyimide film provided with the adhesive layer, a chromium-nickel alloy layer with a thickness of 5 nm and a copper layer with a thickness of 200 nm were deposited in that order by a roll-to-roll type sputtering apparatus with a roll-to-roll system. In the alloy composition, the weight ratio of chromium to nickel was 20:80.

The polyimide film provided with the chromium-nickel alloy layer and the copper layer was cut into a square sheet with a side of 300 mm. The cut polyimide sheet was fixed by suction on the vacuum suction table, and a positive photoresist was applied to the copper layer, followed by drying at 110° C. for 10 minutes. The photoresist was exposed through a photomask and developed to form a resist layer with a thickness of 10 μm in the sections in which the plating layer was not required. In the photomask pattern for testing, as in Example 1, one unit consisted of 380 connecting pads (20 μm wide, 200 μm long) with a pitch of 50 μm arrayed in two parallel columns and a distance of 1.5 mm between the centers of the adjacent pads, and respective units were uniformly arrayed with a pitch of 40 mm in 7 rows and 7 columns on a square polyimide film with a side of 300 mm. At the same time, for the purpose of measuring length, 4 markers were provided on the photomask pattern at four points diagonally apart from the center of the substrate with a distance of approximately 141 mm (the distance between the individual points being 200 mm in parallel to the side).

Using the copper layer as an electrode, a copper layer with a thickness of 5 μm was formed by electroplating. A copper sulfate plating solution was used as the electroplating solution. The photoresist was removed by a photoresist stripper, and the copper layer and the chromium-nickel alloy layer below the resist layer were removed by soft etching using a hydrogen peroxide-sulfuric acid aqueous solution. In the same manner as that in Example 1, a nickel layer with a thickness of 1 μm and a gold layer with a thickness of 0.2 μm were deposited in that order on the copper-plating layer. A metal layer pattern was thereby formed. Next, as in Example 1, a solder resist pattern was formed, and a circuit board was obtained.

The resultant circuit board was stored in an atmosphere of 25° C. and 45% RH for 10 hours. The distance between the two points, which were provided for measuring length, originally about 283 mm apart diagonally (200 mm in the x direction, 200 mm in the y direction) was measured by a length-measuring device SMIC-800 (manufactured by Sokkia Co., Ltd.). As a result, a deviation of 45 μm (45 μm divided by 283 mm equals 0.0159%) from the photomask pattern toward the outside of the board was observed, thus being a failure.

EXAMPLES 4 TO 8

In each Example, a laminated member for a circuit board was obtained in the same manner as that in Example 1 except that the material for the reinforcing plate and the thickness of the reinforcing plate were changed to those shown in Table 1.

After the resultant circuit board was stored in an atmosphere of 25° C. and 45% RH for 10 hours, the distance between the two points, which were provided for measuring length, originally about 283 mm apart diagonally (200 mm in the x direction, 200 mm in the y direction) was measured by a length-measuring device SMIC-800 (manufactured by Sokkia Co., Ltd.). The maximum deviation from the photomask pattern measured is shown in Table 1. The measurement results in Example 1 are also shown in Table 1. In Example 6 in which a glass substrate was used as the reinforcing plate and the product of the Young's modulus and the cube of the thickness was less than 850 kg/mm, the maximum deviation of the circuit pattern was relatively satisfactory at 20 μm relative to 283 mm. However, the deviation is larger compared with Example 1, etc., which may result in a decrease in the yield in the fabrication of circuit substrates.

In order to adjust the peeling strength between the polyimide film and the adhesive, as an adhesive, a mixture of "Oribain" BPS5227-1 (manufactured by Toyo Ink Mfg. Co., Ltd.) and a curing agent BXX5134 (manufactured by Toyo Ink Mfg. Co., Ltd.) at a mixing ratio of 100:5 was used in Example 9. In each of Example 10 and Example 11, a mixture of "Oribain" EXK01-257 (manufactured by Toyo Ink Mfg. Co., Ltd.) and a curing agent BXX5134 (manufactured by Toyo Ink Mfg. Co., Ltd.) at a mixing ratio of 100:9 was used. In Example 12, a mixture of "Cyabain" SH-101 (manufactured by Toyo Ink Mfg. Co., Ltd.) and a curing agent T-501B (manufactured by Toyo Ink Mfg. Co., Ltd.) at a ratio of 100:3 was used. In Example 13, a mixture of "SK-DYNE" SW-11A (manufactured by Soken Chemical and Engineering Co., Ltd.), a curing agent L45 (manufactured by Soken Chemical and Engineering Co., Ltd.), and a curing agent E-5XM (manufactured by Soken Chemical and Engineering Co., Ltd.) at a mixing ratio of 100:2:0.7 was used. In Example 14, a mixture of "SK-DYNE" SW-11A (manufactured by Soken Chemical and Engineering Co., Ltd.), a curing agent L45 (manufactured by Soken Chemical and Engineering Co., Ltd.), and a curing agent E-5XM (manufactured by Soken Chemical and Engineering Co., Ltd.) at a mixing ratio of 100:3:1.5 was used. In Example 15, a mixture of "Oribain" BPS5227-1 (manufactured by Toyo Ink Mfg. Co., Ltd.) and a curing agent BXX5134 (manufactured by Toyo Ink Mfg. Co., Ltd.) at a mixing ratio of 100:2 was used. In Comparative Example 2, a mixture of "Oribain" BPS5673 (manufactured by Toyo Ink Mfg. Co., Ltd.) and a curing agent BHS-8515 (manufactured by Toyo Ink Mfg. Co., Ltd.) at a mixing ratio of 100:5 was used. The peel strength of each adhesive is shown in Table 2. Data for Example 1 is also shown in Table 2.

In each Example, a laminated member for a circuit board was obtained in the same manner as that in Example 1 except that the adhesive described above was used. An edge of the polyimide film was vacuum-sucked and the polyimide film was gradually peeled off the glass substrate. A circuit board thus obtained was stored in an atmosphere of 25° C.

TABLE 1

| | Material for reinforcing plate | Thickness of reinforcing plate (mm) | Young's modulus of reinforcing plate (kg/mm$^2$) | Young's modulus x cube of thickness (kg · mm) | Circuit pattern maximum deviation (μm) | Circuit pattern dimensional change rate (%) |
|---|---|---|---|---|---|---|
| Example 1 | Aluminoborosilicate glass | 0.7 | 7,140 | 2,449 | Within ±5 | 0.0018 or less |
| Example 4 | Soda glass | 2 | 6,832 | 54,656 | Within ±5 | 0.0018 or less |
| Example 5 | Soda glass | 0.5 | 6,832 | 854 | 10 | 0.0035 |
| Example 6 | Soda glass | 0.4 | 6,832 | 437 | 20 | 0.0071 |
| Example 7 | Stainless steel | 0.5 | 20,320 | 2,540 | Within ±5 | 0.0018 or less |
| Example 8 | Stainless steel | 0.05 | 20,320 | 2.5 | 17 | 0.0060 |

EXAMPLES 9 TO 15, COMPARATIVE EXAMPLE 2

As polyimide films, "UPILEX" (manufactured by Ube Industries, Ltd.)(Young's modulus: 930 kg/mm$^2$) with a thickness of 25 μm, 75 μm, and 125 μm, respectively, and "Kapton" (manufactured by DuPont-Toray Co., Ltd.)(Young's modulus: 650 kg/mm$^2$) with a thickness of 25 μm were prepared.

and 45% RH for 10 hours. The distance between the two points, which were provided for measuring length, originally about 283 mm apart diagonally (200 mm in the x direction, 200 mm in the y direction) was measured by a length-measuring device SMIC-800 manufactured by Sokkia Co., Ltd.). The maximum deviation from the photomask pattern measured is shown in Table 2.

The product A×B×C, i.e., the product of the peel strength A (g/cm), the reciprocal B (1/μm) of the thickness of the polyimide film, and the reciprocal C (mm²/kg) of the Young's modulus of the polyimide film, is shown in Table 2. If the product A×B×C was less than $4.3 \times 10^{-6}$, since the polyimide film was detached from the adhesive layer during the formation of the circuit pattern, the photoresist pattern was missing, resulting in a defect pattern. If the product A×B×C exceeded $4.3 \times 10^{-3}$, the polyimide film was extremely curled after peeling. The polyimide film was also deformed due to stress during peeling, resulting in a large distortion in the circuit pattern on the polyimide film.

TABLE 2

| | Thickness of polyimide film (1/B) (μm) | Young's modulus of polyimide film (1/C) (kg/mm²) | Peel strength (A) (g/cm) | A × B × C | Appearance after peeling | Circuit pattern maximum deviation (μm) | Circuit pattern dimensional change rate (%) |
|---|---|---|---|---|---|---|---|
| Example 1 | 25 | 930 | 2 | $8.60^{-5}$ | Satisfactory | Within ±5 | 0.0018 or less |
| Example 9 | 25 | 930 | 15 | $6.45^{-4}$ | Satisfactory | Within ±5 | 0.0018 or less |
| Example 10 | 25 | 930 | 9 | $3.87^{-4}$ | Satisfactory | Within ±5 | 0.0018 or less |
| Example 11 | 25 | 650 | 9 | $5.54^{-4}$ | Satisfactory | 8 | 0.0028 |
| Example 12 | 125 | 930 | 73 | $6.28^{-4}$ | Satisfactory | 13 | 0.0046 |
| Example 13 | 75 | 930 | 1.2 | $1.72^{-5}$ | Partially detached in the process | Within ±5 | 0.0018 or less |
| Example 14 | 25 | 930 | 0.08 | $3.44^{-6}$ | Detached in the process | — | Missing pattern |
| Example 15 | 25 | 930 | 57 | $2.45^{-3}$ | Slightly curled | 26 | 0.0092 |
| Comparative Example 2 | 25 | 930 | 330 | $1.42^{-2}$ | Extremely curled | 130 | 0.0459 |

EXAMPLES 16 TO 18

Laminated members for circuit boards were obtained in the same matter as that in Example 1 except that the thickness of the self-stick, removable adhesive was set at 4.5 μm, 6 μm, and 15 μm, respectively. With respect to each member for a circuit board, while heating an IC chip model, in which 380 bumps plated with gold were arrayed with a pitch of 50 μm per one row and two rows were arrayed with a separation of 1.5 mm, at 150° C. from the chip side, using an ultrasonic bonder FC2000 (manufactured by Toray Engineering Co., Ltd.), metal diffusion bonding with connecting pads on the circuit board was performed. The pressure for each bump was 30 g. A cross section of the connecting part was taken and observed by an electron microscope to measure the sinking of the bump. The results thereof are shown in Table 3 below. Data in Example 1 is also shown in Table 3.

If the thickness of the self-stick, removable adhesive layer was 5 μm or less, the sinking of the bump was 6 μm or less, which caused no problems in electrical connection reliability. On the other hand, if the thickness of the self-stick, removable adhesive layer exceeded 5 μm, the sinking of the bump exceeded 6 μm, resulting in a problem in reliability.

TABLE 3

| | Thickness of adhesive layer (μm) | Sinking (μm) |
|---|---|---|
| Example 1 | 1 | 1.7 |
| Example 16 | 4.5 | 5.8 |
| Example 17 | 6 | 7.5 |
| Example 18 | 15 | 13 |

EXAMPLE 19

A member for a circuit board was obtained in the same manner as that in Example 1 except that the auxiliary adhesive layer was not provided. An edge of the polyimide film was vacuum-sucked and the polyimide film was gradually peeled off the glass substrate. The self-stick, removable adhesive layer was partially detached from the glass and remained on the polyimide film. After the polyimide film was peeled off, a step of cleaning the polyimide film was required, resulting in a decrease in productivity.

EXAMPLE 20

An adhesive for improving the adhesion of the metal layer was prepared in the same manner as that in Example 1. The adhesive was continuously applied to a long polyimide film ("UPILEX" manufactured by Ube Industries, Ltd.) with a thickness of 25 μm and a width of 300 mm, followed by drying and curing. Similarly, the adhesive was applied to the other surface of the polyimide film, followed by drying and curing.

As an auxiliary adhesive, γ-aminopropyltriethoxy silane was dissolved in isopropyl alcohol so as to obtain a concentration of 5% by weight. The auxiliary adhesive solution was applied by a spin coater to a square soda glass with a side of 300 mm and a thickness of 0.5 mm, followed by drying at 100° C. for 5 minutes. The dried auxiliary adhesive layer had a thickness of 300 nm. A mixture obtained by mixing an acrylic adhesive "SK-DYNE" SW-11A (manufactured by Soken Chemical and Engineering Co., Ltd.), in which adhesion was decreased by ultraviolet curing, with a curing agent L45 (manufactured by Soken Chemical and Engineering Co., Ltd.) at a mixing ratio of 50:1 was applied to the glass substrate provided with the auxiliary adhesive layer, followed by drying at 80° C. for 2 minutes. The dried adhesive layer had a thickness of 1 μm. Two glass substrates provided with the auxiliary adhesive layers and the self-stick, removable adhesive layers were prepared. Next, an air-shielding film composed of a film in which an easily releasable silicone resin layer was placed on a polyester film was attached to the adhesive layer and was left to stand for one week. The glass substrate had a Young's modulus of 6,832 kg/mm², and the product of the Young's modulus (kg/mm²) and the cube of the thickness (mm) was 854 kg·mm.

The polyimide film on which the adhesive for improving the adhesion of the metal layer was coated was cut into a square with a side of 300 mm and was stored in an atmosphere of 25° C. and 45% RH for 10 hours. Next, in the same manner as that in Example 1, the polyimide film provided with the adhesive layer was laminated to the first glass substrate provided with the self-stick, removable adhesive layer. The glass substrate to which the polyimide film was laminated was removed from the stage, and the adhesive layer was cured by ultraviolet irradiation at 1,000 mJ/cm² from the glass substrate side.

On the polyimide film laminated on the glass substrate, a chromium-nickel alloy layer with a thickness of 4 nm and a copper layer with a thickness of 200 nm were deposited in that order by sputtering. In the alloy composition, the weight ratio of chromium to nickel was 20:80.

A positive photoresist was applied to the copper layer by a spin coater and dried at 110° C. for ten minutes. The photoresist was exposed through a photomask. Next, the photoresist was developed, and a resist layer with a thickness of 10 μm was thereby formed in the sections which did not require a plating layer. Four markers were provided on the photomask pattern at four points diagonally apart from the center of the substrate with a distance of approximately 141 mm (the distance between the individual points being 200 mm in parallel to the side).

Next, using the copper layer as an electrode, a copper layer with a thickness of 5 μm was formed by electroplating. A copper sulfate plating solution was used as the electroplating solution. The photoresist was removed by a photoresist stripper, and the copper layer and the chromium-nickel alloy layer below the resist layer were removed by soft etching using a hydrogen peroxide-sulfuric acid aqueous solution.

The distance between the two points, which were provided for measuring length as described above, originally about 283 mm apart diagonally (200 mm in the x direction, 200 mm in the y direction) was measured by a length-measuring device SMIC-800 (manufactured by Sokkia Co., Ltd.). As a result, dimensional change rate was extremely satisfactory, i.e., within ±5 μm (±5 μm divided by 283 mm equals ±0.0018%) relative to the photomask pattern.

After the air-shielding film was removed from the second glass substrate provided with the auxiliary adhesive layer and the self-stick, removable adhesive layer, the polyimide film provided with the copper layer pattern was placed thereon, and both were laminated with each other by passing them through a roll laminator MAII-550 (manufactured by Taisei Laminator Co., Ltd.). Both the upper roller and the lower roller were metal rollers coated with rubber. The rubber hardness of the upper roller was Hs50, and the rubber hardness of the lower roller was Hs70.

The surface of the second glass substrate was fixed on a vacuum suction table, and an edge of the first glass substrate was vacuum-sucked and the first glass substrate was gradually peeled off. After the first glass substrate was removed, the second glass substrate was detached from the vacuum suction table, and the adhesive layer was cured by ultraviolet irradiation at 1,000 mJ/cm² from the glass substrate side.

On the polyimide film laminated on the glass substrate, a chromium-nickel alloy layer with a thickness of 4 nm and a copper layer with a thickness of 200 nm were deposited in that order by sputtering. In the alloy composition, the weight ratio of chromium to nickel was 20:80.

A positive photoresist was applied to the copper layer by a spin coater and dried at 110° C. for ten minutes. The photoresist was exposed through a photomask. Next, the photoresist was developed, and a resist layer with a thickness of 10 μm was thereby formed in the sections which did not require a plating layer. Four markers were provided on the photomask pattern at four points diagonally apart from the center of the substrate with a distance of approximately 141 mm (the distance between the individual points being 200 mm in parallel to the side).

Next, using the copper layer as an electrode, a copper layer with a thickness of 5 μm was formed by electroplating. A copper sulfate plating solution was used as the electroplating solution. The photoresist was removed by a photoresist stripper, and the copper layer and the chromium-nickel alloy layer below the resist layer were removed by soft etching using a hydrogen peroxide-sulfuric acid aqueous solution.

The distance between the two points, which were provided for measuring length as described above, originally about 283 mm apart diagonally (200 mm in the x direction, 200 mm in the y direction) was measured by a length-measuring device SMIC-800 (manufactured by Sokkia Co., Ltd.). As a result, dimensional change rate was extremely satisfactory, i.e., within ±5 μm (±5 μm divided by 283 mm equals ±0.0018%) relative to the photomask pattern.

An edge of the polyimide film was vacuum-sucked and the polyimide film was gradually peeled off the glass substrate to obtain a circuit board. The resultant circuit board was stored in an atmosphere of 25° C. and 45% RH for 10 hours. The distance between the two points, which were provided for measuring length, originally about 283 mm apart diagonally (200 mm in the x direction, 200 mm in the y direction) was measured by the length-measuring device SMIC-800. As a result, dimensional change rate was maintained extremely satisfactorily, i.e., within ±5 μm (±5 μm divided by 283 mm equals ±0.0018%) relative to the photomask pattern.

COMPARATIVE EXAMPLE 3

A laminated member for a circuit board was fabricated in the same manner as that in Example 1 except that, instead of curing the adhesive layer by ultraviolet irradiation from the glass substrate side, after the polyimide film was laminated to the glass substrate, ultraviolet irradiation was performed immediately before the application of the solder resist. When the photoresist applied on the copper layer was dried, foaming occurred in the adhesive layer, resulting in irregularities on the surface of the polyimide film. In the wet process, the self-stick, removable adhesive layer swelled and the holding power for holding the polyimide film was decreased. Therefore, when the distance between the two points, which were provided for measuring length, originally about 283 mm apart diagonally (200 mm in the x direction, 200 mm in the y direction) was measured by the length-measuring device SMIC-800, a maximum deviation of 80 μm (80 μm divided by 283 mm equals 0.028%) from the photomask pattern was found.

When the polyimide film of the resultant laminated member for the circuit board was peeled from the glass substrate, the peel strength was 40 g/cm, which was larger than that in Example 1, and the circuit substrate after peeling was slightly curled. The product A×B×C, i.e., the product of the peel strength A (g/cm), the reciprocal B (1/μm) of the thickness of the polyimide film, and the reciprocal C (mm²/kg) of the Young's modulus of the polyimide film, was 1.72×10⁻³.

COMPARATIVE EXAMPLE 4

A laminated member for a circuit board was obtained in the same manner as that in Example 1 except that a roll laminator was used when the polyimide film was laminated to the glass substrate provided with the self-stick, removable adhesive layer. As the roll laminator, MAII-550 (manufactured by Taisei Laminator Co., Ltd.) was used. Both the upper roller and the lower roller were metal rollers coated with rubber. The rubber hardness of the upper roller was Hs50, and the rubber hardness of the lower roller was Hs70.

An edge of the polyimide film was vacuum-sucked and the polyimide film was gradually peeled off the glass substrate. A circuit board was thereby obtained. The resultant circuit board was stored in an atmosphere of 25° C. and 45% RH for 10 hours. The distance between the two points, which were provided for measuring length, originally about 283 mm apart diagonally (200 mm in the x direction, 200 mm in the y direction) was measured by the length-measuring device SMIC-800. As a result, the polyimide film was deformed due to stress applied during lamination. Expansion occurred in the roller passage direction and shrinkage occurred in a direction perpendicular to the roller passage direction. That is, stress in the polyimide film was released by the peeling of the polyimide film, and strain occurred in the circuit pattern on the polyimide film. The maximum strain was 100 μm (100 μm divided by 283 mm equals 0.035%) relative to the photomask pattern.

EXAMPLE 21

A laminated member for a circuit board was obtained in the same manner as that in Example 1 except that the following method was employed when the polyimide film was laminated to the glass substrate provided with the self-stick, removable adhesive layer.

Figure 3:
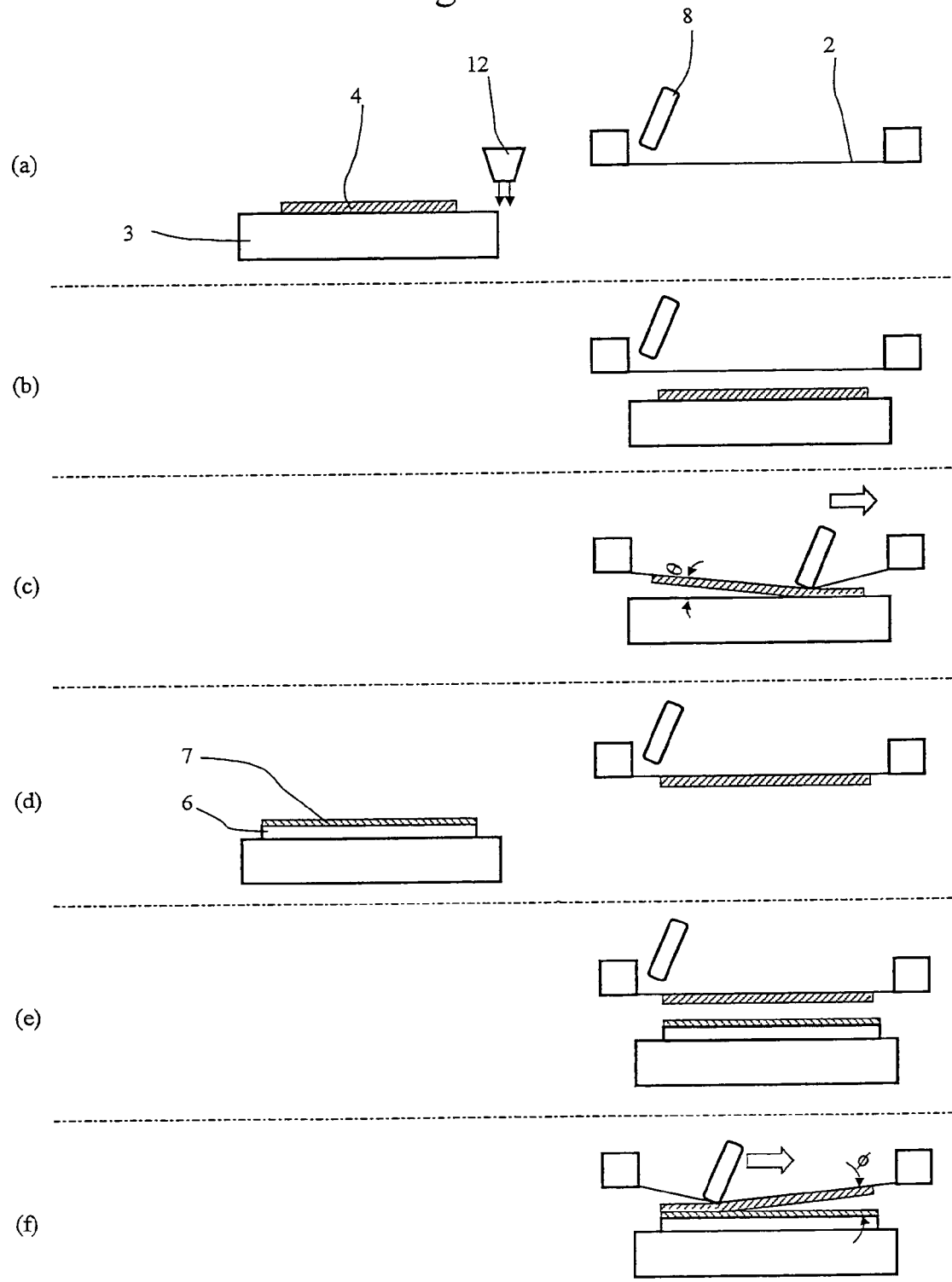
FIGS. 3(a) to 3(f) are front views which schematically show steps in a lamination method in accordance with the present invention.

A polyimide film 4 provided with a self-stick, removable adhesive layer, cut into a square with a side of 300 mm was placed on the stage 3 provided with a vacuum suction mechanism shown in FIG. 3, and vacuum suction was performed. Water was then sprayed onto the polyimide film by a nozzle (not shown in the drawing). A 100-mesh screen gauze 2 composed of polyester fibers was placed so as to face the polyimide film 5 in parallel with a separation of 0.7 mm therebetween. The surface of the screen gauze 2 opposite to the surface abutting on the polyimide film was squeegeed by a rubber plate 8, and while decreasing the thickness of the water film between the polyimide film 4 and the screen gauze 2, the screen gauze 2 and the polyimide film 4 were brought into close contact with each other. The vacuum suction of the stage 3 was stopped, the screen gauze was moved upward, and the polyimide film 4 was transferred to the screen gauze 2. The openings of the screen gauze were placed inside the region which was laminated to the polyimide film by 2 mm so that excess water did not spread over the stage.

The glass substrate 6 provided with the self-stick, removable adhesive layer 7 was placed on the stage 3 provided with the vacuum suction mechanism. The screen gauze 2 laminated with the polyimide film 4 was moved to the position above the glass substrate 6.

The screen gauze 2 was moved downward and placed above the glass substrate with a separation of 0.7 mm. Next, the surface of the screen gauze 2 opposite to the surface abutting on the polyimide film was squeegeed by a rubber plate 8 with a Shore hardness of 50 to press the polyimide film 4 against the self-stick, removable adhesive layer 7, and the polyimide film 4 was thereby transferred to the glass substrate.

An edge of the polyimide film was vacuum-sucked and the polyimide film was gradually peeled off the glass substrate. A circuit board was thereby obtained. The resultant circuit board was stored in an atmosphere of 25° C. and 45% RH for 10 hours. The distance between the two points, which were provided for measuring length, originally about 283 mm apart diagonally (200 mm in the x direction, 200 mm in the y direction) was measured by the length-measuring device SMIC-800. As a result, dimensional change rate was maintained extremely satisfactorily, i.e., within ±5 μm (±5 μm divided by 283 mm equals ±0.0018%) relative to the photomask pattern.

EXAMPLE 22

A laminated member for a circuit board was obtained in the same manner as that in Example 1 except that the following method was employed when the polyimide film was laminated to the glass substrate provided with the adhesive layer.

An emulsion was applied over the entire surface to a 100-mesh screen gauze 2 composed of polyester filaments to seal the openings. By screen-printing the same material as that for the self-stick, removable adhesive layer provided on the glass substrate, dot-shaped adhesive parts were formed on the screen gauze 2. The dot had a diameter of 0.5 mm, and the distance between the adjacent dots was 5 mm. The dots were uniformly placed on the screen gauze at the surface abutting on the polyimide film.

A polyimide film 4 was cut into a square with a side of 300 mm on which an adhesive was deposited, and was placed on stage 3 provided with a vacuum suction mechanism shown in FIG. 3, and vacuum suction was performed. The screen gauze 2 provided with the dot-shaped adhesive parts was placed so as to face the polyimide film 4 in parallel. The screen gauze 2 was moved downward so as to face the polyimide film 4 in parallel with a separation of 0.7 mm. The surface of the screen gauze 2 opposite to the surface abutting on the polyimide film was squeegeed by a rubber plate 8, and the screen gauze 2 and the polyimide film 4 were brought into close contact with each other. The vacuum suction of the stage 3 was stopped, the screen gauze 2 was moved upward, and the polyimide film 4 was transferred to the screen gauze 2.

The glass substrate 6 provided with the self-stick, removable adhesive layer 7 was placed on the stage 3 provided with the vacuum suction mechanism. The screen gauze 2 laminated with the polyimide film 4 was moved downward and placed parallel to the glass substrate 6 with a separation of 0.7 mm. Next, the surface of the screen gauze 2 opposite to the surface abutting on the polyimide film was squeegeed by the rubber plate 8 to press the polyimide film 4 against the self-stick, removable adhesive layer 7, and the polyimide film 4 was thereby transferred to the glass substrate.

An edge of the polyimide film was vacuum-sucked and the polyimide film was gradually peeled off the glass substrate. A circuit board was thereby obtained. The resultant circuit board was stored in an atmosphere of 25° C. and 45% RH for 10 hours. The distance between the two points, which were provided for measuring length, originally about 283 mm apart diagonally (200 mm in the x direction, 200 mm in the y direction) was measured by the length-measuring device SMIC-800. As a result, dimensional change rate was maintained extremely satisfactorily, i.e., within ±5 μm (±5 μm divided by 283 mm equals ±0.0018%) relative to the photomask pattern.

INDUSTRIAL APPLICABILITY

The circuit boards of the present invention are favorably used for wiring boards for electronic apparatuses, interposers for IC packaging, wiring boards for wafer level burn-in sockets, and the like.

The invention claimed is:

1. A circuit board comprising a flexible film and a circuit pattern comprising a metal provided on the flexible film, wherein dimensional change rate of the circuit pattern is within ±0.01%, wherein the circuit board is made by a method comprising the steps of laminating the flexible film to a reinforcing plate with a self-stick, removable organic layer having a thickness of 5 μm or less; forming the circuit pattern; and peeling the flexible film off the reinforcing plate, and wherein the following condition is satisfied: A×B×C is in the range of $4.3 \times 10^{-6}$ to $4.3 \times 10^{-3}$, where A is the peel strength (g/cm) of the flexible film to the self-stick, removable organic layer, B is the reciprocal ($\mu m^{-1}$) of the thickness of the flexible film, and C is the reciprocal ($mm^2$/kg) of the Young's modulus of the flexible film.

2. A laminated member for a circuit board, comprising a reinforcing plate, a self-stick, removable organic layer, a flexible film, and a first circuit pattern comprising a metal laminated in that order, wherein the self-stick, removable organic layer has a thickness of 5 μm or less.

3. A laminated member for a circuit board according to claim 2, wherein the reinforcing plate, the self-stick, removable organic layer, a second circuit pattern comprising a metal, the flexible film, and the first circuit pattern comprising a metal are laminated in that order.

4. A laminated member for a circuit board according to claim 2, further comprising electronic components bonded to the first circuit pattern comprising the metal.

5. A laminated member for a circuit board according to claim 2, wherein the Young's modulus of the reinforcing plate (kg/mm$^2$) multiplied by the cube of the thickness (mm) of the reinforcing plate is 2 to 860,000 kg·mm.

6. A laminated member for a circuit board according to claim 2, wherein the reinforcing plate is a sheet.

7. A laminated member for a circuit board according to claim 2, wherein the reinforcing plate comprises a glass, and the Young's modulus of the reinforcing plate (kg/mm$^2$) multiplied by the cube of the thickness (mm) of the reinforcing plate is 850 to 860,000 kg·mm.

8. A laminated member for a circuit board according to claim 2, wherein the reinforcing plate comprises a metal, and the Young's modulus of the reinforcing plate (kg/mm$^2$) multiplied by the cube of the thickness (mm) of the reinforcing plate is 2 to 162,560 kg·mm.

9. A laminated member for a circuit board according to claim 2, wherein A×B×C is in the range of $4.3 \times 10^{-6}$ to $4.3 \times 10^{-3}$, wherein A is the peel strength (g/cm) of the flexible film to the self-stick, removable organic layer, B is the reciprocal ($\mu m^{-1}$) of the thickness of the flexible film, and C is the reciprocal (mm$^2$/kg) of the Young's modulus of the flexible film.

10. A laminated member for a circuit board according to claim 2, further comprising an auxiliary adhesive layer placed between the reinforcing plate and the self-stick, removable organic layer.

11. A laminated member for a circuit board comprising at least a reinforcing plate, a self-stick, removable organic layer, a circuit pattern comprising a metal, and a flexible film, laminated in that order, wherein the self-stick, removable organic layer has a thickness of 5 μm or less.

* * * * *

UNITED STATES PATENT AND TRADEMARK OFFICE
CERTIFICATE OF CORRECTION

| | | |
|---|---|---|
| PATENT NO. | : 7,105,221 B2 | Page 1 of 1 |
| APPLICATION NO. | : 10/450415 | |
| DATED | : September 12, 2006 | |
| INVENTOR(S) | : Takayoshi Akamatsu et al. | |

It is certified that error appears in the above-identified patent and that said Letters Patent is hereby corrected as shown below:

Title page, item (75), delete "Nobuyuki Kuroki".

Signed and Sealed this

Tenth Day of July, 2007

JON W. DUDAS
*Director of the United States Patent and Trademark Office*